United States Patent
Jedinger et al.

(10) Patent No.: US 11,870,318 B2
(45) Date of Patent: Jan. 9, 2024

(54) HOMOPOLAR LINEAR SYNCHRONOUS MACHINE

(71) Applicant: HYPERLOOP TECHNOLOGIES, INC., Los Angeles, CA (US)

(72) Inventors: Alexander Jedinger, Los Angeles, CA (US); Arbi Gharakhani Siraki, Los Angeles, CA (US); Erik Johnson, Los Angeles, CA (US); Shahriyar Beizaee, Los Angeles, CA (US); Rachel Ozer, Los Angeles, CA (US); Ju Hyung Kim, Los Angeles, CA (US)

(73) Assignee: HYPERLOOP TECHNOLOGIES, INC., Los Angeles, CA (US)

( * ) Notice: Subject to any disclaimer, the term of this patent is extended or adjusted under 35 U.S.C. 154(b) by 0 days.

(21) Appl. No.: 17/894,791

(22) Filed: Aug. 24, 2022

(65) Prior Publication Data

US 2022/0416636 A1  Dec. 29, 2022

Related U.S. Application Data

(63) Continuation of application No. 17/274,886, filed as application No. PCT/US2019/051701 on Sep. 18, 2019, now Pat. No. 11,496,035.
(Continued)

(51) Int. Cl.
*H02K 41/03* (2006.01)
*H02K 3/24* (2006.01)
(Continued)

(52) U.S. Cl.
CPC ......... *H02K 41/03* (2013.01); *G01R 33/3856* (2013.01); *H02K 1/20* (2013.01);
(Continued)

(58) Field of Classification Search
CPC .... F01D 17/162; F04D 25/163; F04D 29/057; F04D 29/083; F04D 29/462; F04D 29/56;
(Continued)

(56) References Cited

U.S. PATENT DOCUMENTS 3,456,136 A  7/1969 Pierro
3,585,423 A  6/1971 Bolton et al.
(Continued)

FOREIGN PATENT DOCUMENTS

CH        588187 A5   5/1977
CN     106374648 A    2/2017
(Continued)

OTHER PUBLICATIONS

WO-2021092118-A1, Godinez, All Pages (Year: 2021).*
(Continued)

*Primary Examiner* — Naishadh N Desai
(74) *Attorney, Agent, or Firm* — Seyfarth Shaw LLP

(57) ABSTRACT

Homopolar linear synchronous machines are provided herein that include a mover device. The mover device includes a cold plate with ferromagnetic cores extending through slots in the cold plate. Layers of armature coils are located around the ferromagnetic cores on opposite sides of the cold plate. The mover device further includes at least one field coil.

18 Claims, 17 Drawing Sheets

Related U.S. Application Data

(60) Provisional application No. 62/733,551, filed on Sep. 19, 2018.

(51) Int. Cl.

| | | |
|---|---|---|
| G01R 33/385 | (2006.01) | |
| H02K 1/20 | (2006.01) | |
| H02K 3/22 | (2006.01) | |
| H02K 15/02 | (2006.01) | |
| H02K 3/04 | (2006.01) | |
| H02K 9/22 | (2006.01) | |
| H02K 19/10 | (2006.01) | |

(52) U.S. Cl.
CPC ............... *H02K 3/04* (2013.01); *H02K 3/22* (2013.01); *H02K 3/24* (2013.01); *H02K 9/22* (2013.01); *H02K 15/02* (2013.01); *H02K 19/10* (2013.01)

(58) Field of Classification Search
CPC ............ F04D 29/563; F05D 2220/32; F05D 2250/51; Y02E 60/50; G01R 33/3856; H02K 1/141; H02K 1/143; H02K 1/20; H02K 1/24; H02K 11/21; H02K 15/02; H02K 19/10; H02K 3/04; H02K 3/22; H02K 3/24; H02K 3/28; H02K 3/524; H02K 3/527; H02K 41/03; H02K 9/22
See application file for complete search history.

(56) References Cited

U.S. PATENT DOCUMENTS

| | | | |
|---|---|---|---|
| 3,699,365 A | | 10/1972 | Leitgeb |
| 3,836,799 A | * | 9/1974 | Eastham .............. H02K 41/025 |
| | | | 104/282 |
| 3,842,747 A | | 10/1974 | Schwarzler |
| 3,850,108 A | | 11/1974 | Winkle |
| 3,860,839 A | | 1/1975 | Buchberger et al. |
| 3,884,154 A | | 5/1975 | Marten |
| 3,890,906 A | | 6/1975 | Maki |
| 3,919,607 A | | 11/1975 | Habock et al. |
| 4,408,145 A | | 10/1983 | Artemenko et al. |
| 4,793,263 A | | 12/1988 | Basic et al. |
| 4,839,545 A | | 6/1989 | Chitayat |
| 5,249,529 A | | 10/1993 | Herbermann |
| 5,479,145 A | | 12/1995 | Kalsi |
| 5,783,877 A | * | 7/1998 | Chitayat .................. H02K 9/24 |
| | | | 310/12.33 |
| 6,661,124 B1 | | 12/2003 | Seki |
| 6,825,583 B2 | | 11/2004 | Joung et al. |
| 9,325,222 B2 | | 4/2016 | Shinohira et al. |
| 10,003,246 B2 | | 6/2018 | Ragan |
| 10,177,640 B2 | | 1/2019 | Achterberg et al. |
| 10,193,428 B2 | | 1/2019 | Kusase |
| 10,236,791 B1 | * | 3/2019 | Chung .............. H02M 7/53871 |
| 10,279,441 B2 | | 5/2019 | Hanamachi |
| 10,873,245 B2 | | 12/2020 | Fernandes Goncalves et al. |
| 11,139,721 B2 | | 10/2021 | Trolliet et al. |
| 2003/0141769 A1 | | 7/2003 | Kubo |
| 2005/0089421 A1 | | 4/2005 | Burger et al. |
| 2007/0205038 A1 | * | 9/2007 | Tominaga ............ B62D 5/0406 |
| | | | 180/444 |
| 2007/0257563 A1 | | 11/2007 | Huang et al. |
| 2008/0111439 A1 | | 5/2008 | Huang et al. |
| 2008/0245508 A1 | | 10/2008 | Shimura et al. |
| 2009/0127938 A1 | | 5/2009 | Sahin Nomaler et al. |
| 2010/0295385 A1 | | 11/2010 | Hsu et al. |
| 2011/0306467 A1 | | 12/2011 | Massa |
| 2015/0162812 A1 | | 6/2015 | Da Conceição Rosa |
| 2016/0102928 A1 | | 4/2016 | Da Conceição Rosa |
| 2016/0189845 A1 | | 6/2016 | Ito et al. |
| 2016/0359402 A1 | | 12/2016 | Makino et al. |
| 2017/0264182 A1 | | 9/2017 | Ragan |
| 2019/0177097 A1 | * | 6/2019 | Wernersbach ......... H02K 41/03 |
| 2020/0124688 A1 | | 4/2020 | Wang et al. |
| 2021/0021163 A1 | | 1/2021 | Ma |

FOREIGN PATENT DOCUMENTS

| | | | | |
|---|---|---|---|---|
| CZ | 20022690 | A3 | 5/2003 | |
| DE | 2426968 | A1 | 1/1976 | |
| DE | 3001095 | A1 | 7/1981 | |
| DE | 3629423 | A1 | 3/1988 | |
| DE | 102016122612 | A1 | 5/2018 | |
| EP | 1276205 | A2 * | 1/2003 | .............. H02K 3/24 |
| EP | 1156579 | B1 | 10/2008 | |
| GB | 1472898 | A * | 5/1977 | ............. H02K 17/12 |
| JP | H01255404 | A | 10/1989 | |
| JP | 2002218729 | A | 8/2002 | |
| JP | 2004516787 | A * | 6/2004 | |
| WO | 2008132041 | A1 | 11/2008 | |
| WO | WO-2021092118 | A1 * | 5/2021 | .............. B60L 13/03 |

OTHER PUBLICATIONS

GB-1472898-A, All Pages (Year: 1977).*
EP-1276205-A2, Liebermann, All Pages (Year: 2003).*
JP-2004516787-A, All Pages (Year: 2004).*
Jedinger, Alexander, et al., "Homopolar Linear Synchronous Machine", corresponding U.S. Appl. No. 17/274,886, filed Mar. 10, 2021.
Jedinger, Alexander, et al., "Homopolar Linear Synchronous Machine", corresponding PCT Application No. PCT/US2019/051701, filed Sep. 18, 2019.
Bird, Jonathan. An Investigation into the use of Electrodynamic Wheels For High-Speed Ground Transportation. Diss. University of Wisconsin—Madison, 2006. Available online at: https://www.researchgate.net/publication/234217871_An_investigation_into_the_use_of_electrodynamic_wheels_for_highspeed_ground_transportation.
Boldea, I, Linear Electric Machines, Drives, and MAGLEVs Handbook, Boca Ratan, London, pp. 39-44. New York: CRC Press, 2013. Available online at: https://books.google.com/books?id=-sBZUSEhjdcC&printsec=frontcover#/v=onepage&q&f=false.
Cassat, A. et al. "MAGLEV projects technology aspects and choices." IEEE Transactions on applied superconductivity 12.1 (2002): 915-925.
Cassat, A., et al. "SWISSMETRO: Combined Propulsion with Levitation and Guidance," 18th International Conference on Magnetically Levitated Systems and Linear Drives, 2004, p. 747. Shanghai, China.
Cassat, Alain et al. "MAGLEV—Worldwide Status and Technical Review". Electrotechnique de Futur 2011, Dec. 14 & 15, 2011, Belfort France.
Laithwaite, E, "Magnetic River mixes lift and thrust," New Scientist, p. 805, Jun. 28, 1973. Partially available online at: https://books.google.com/books?id=SOnn3r855xsC&pg=PA805&lpg=PA805&dq=Magnetic+River+mixes+lift+and+thrust&source=bl&ots=xqPu1E-9n8&sig=ACfU3U0fHYYYtRrdYCV6mNOPDIhHqXSpJO&hl=en&sa=X&ved=2ahUKEwj7r8qcTwAhVaHjCIIHXSAA9UQ6AEwEXoECAkQAw.
International Search Report dated Nov. 28, 2019, issued in corresponding PCT Application No. PCT/US2019/051701, Filed Sep. 18, 2019.
SwissMetro-Ng, "SwissMetro-NG, New Generation Swiss Intercity Transportation". Online at: https://www.swissmetro-ng.org/file/SwissMetro-NG%20Pr%C3%A4sentationen/SwissMetro-NG%20Presentation%2011_8%20E.pdf, Published Mar. 26, 2021.
https://www.theworldmaterial.com/type-304-grade-stainless-steel/ (Year: 2022).

* cited by examiner ature coils, according to non-limiting examples.
HOMOPOLAR LINEAR SYNCHRONOUS MACHINE

CROSS-REFERENCE TO RELATED APPLICATIONS

The present specification is a continuation of U.S. patent application Ser. No. 17/274,886, which is a national stage application, filed under 35 U.S.C. § 371, of International Patent Application No. PCT/US2019/051701, filed on Sep. 18, 2019, which claims priority from U.S. Patent Application No. 62/733,551, filed Sep. 19, 2018, the contents of all of which are incorporated herein by reference.

BACKGROUND

A direct drive motor is a type of synchronous motor that directly drives a load, rather than using a transmission or gear box. Linear motors are generally direct drive motors as it is generally not feasible to have any intermediary components. The constraints of a transportation system that seeks to promote high-speed, high-efficiency, and high-power density, impose challenges that are not present in the state of the art.

BRIEF DESCRIPTIONS OF THE DRAWINGS

For a better understanding of the various examples described herein and to show more clearly how they may be carried into effect, reference will now be made, by way of example only, to the accompanying drawings in which.

Figure 5A:
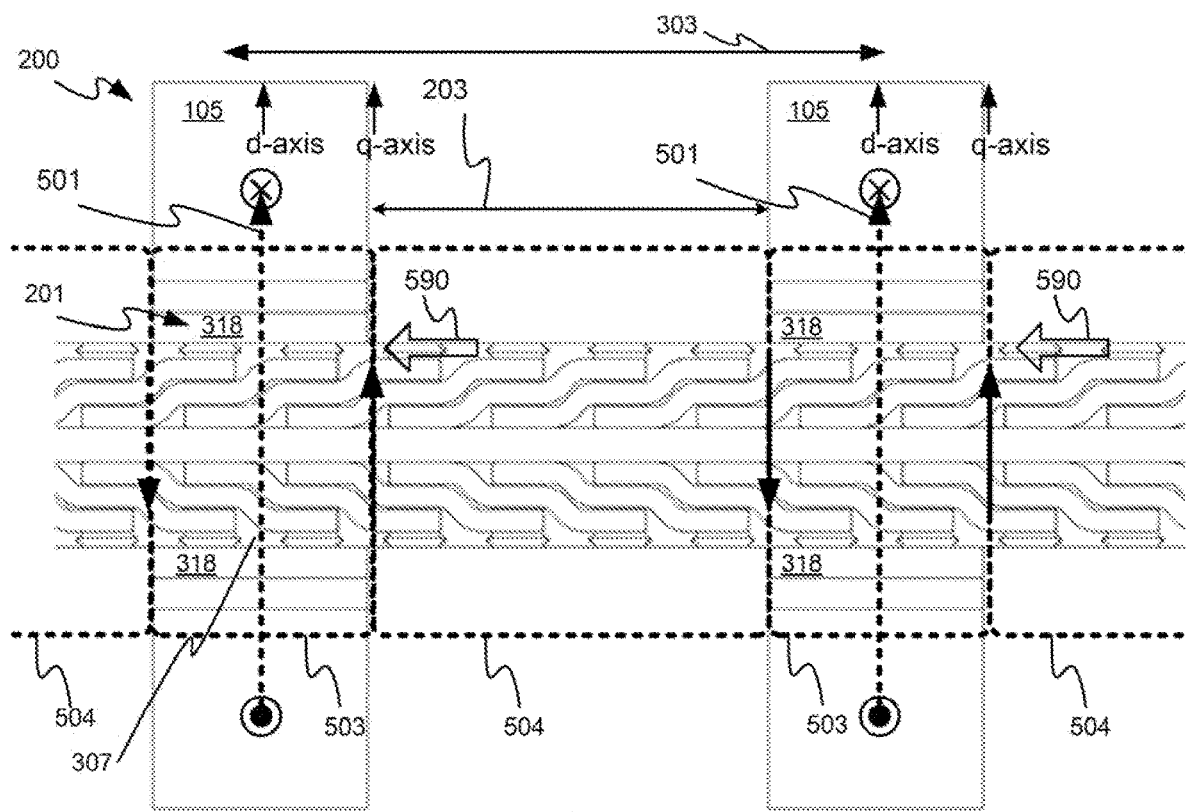
Figure 5B:
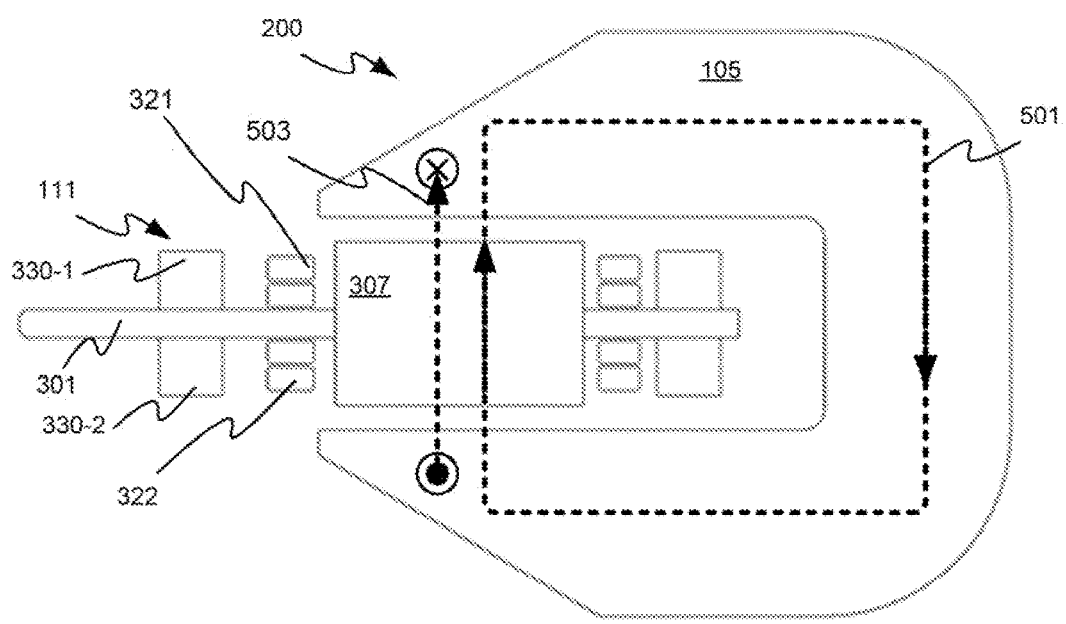

FIG. 5A and FIG. 5B respectively depict a side and cross-sectional view of a portion of the homopolar linear synchronous motor, along with magnetic flux paths that occur during operation thereof, according to non-limiting examples.

Figure 6:
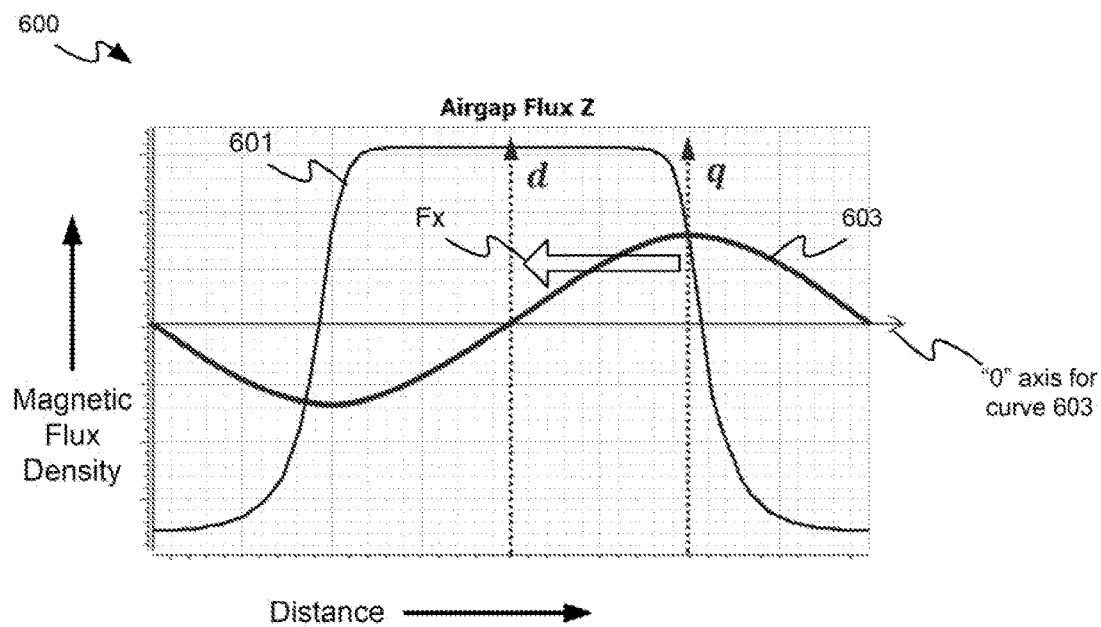

FIG. 6 depicts magnetic flux density as a function of position, of a portion of the homopolar linear synchronous motor, according to non-limiting examples.

Figure 7:
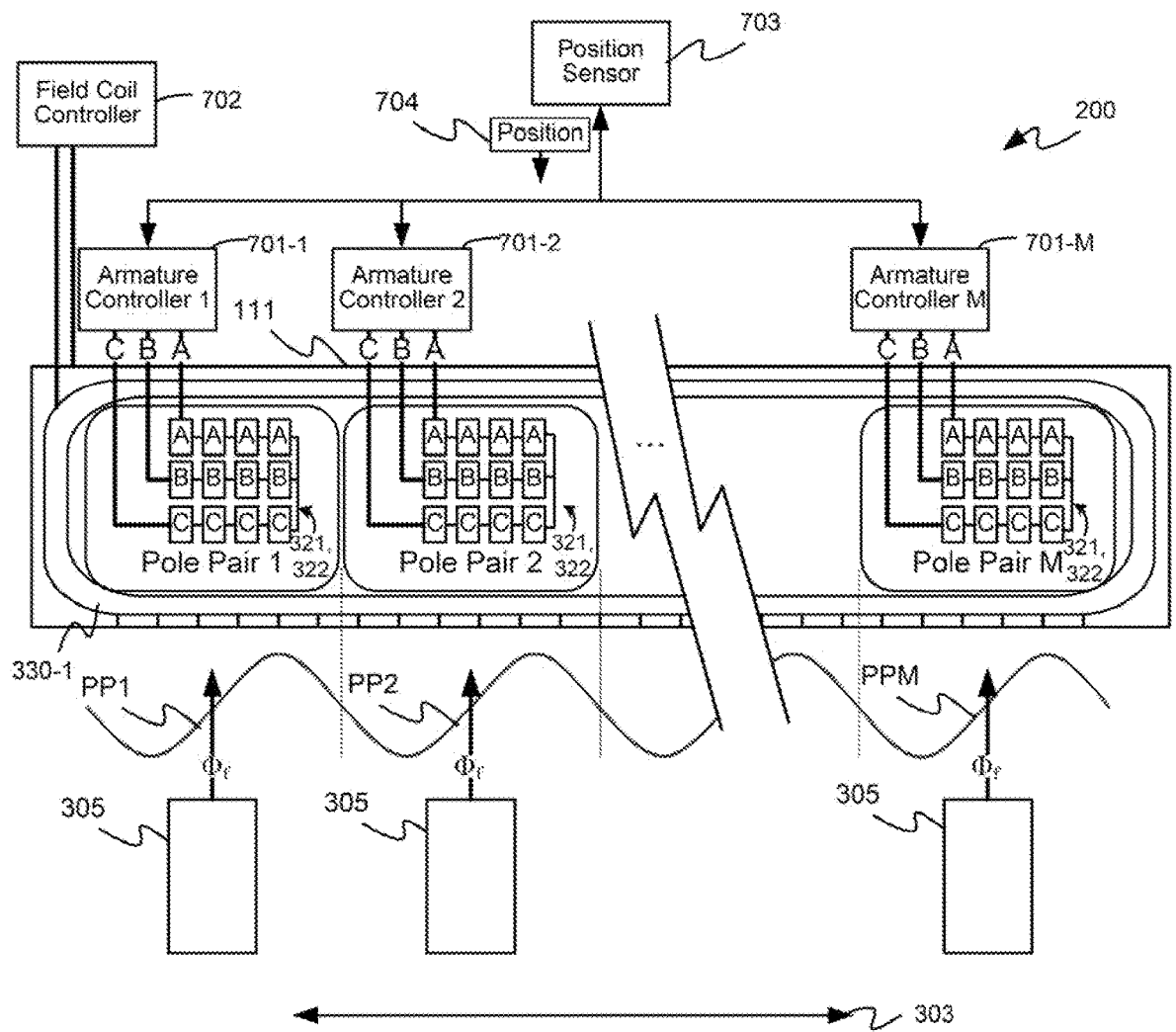

FIG. 7 depicts a schematic block diagram of electrical components of a mover device of a homopolar linear synchronous motor, according to non-limiting examples.

Figure 8:
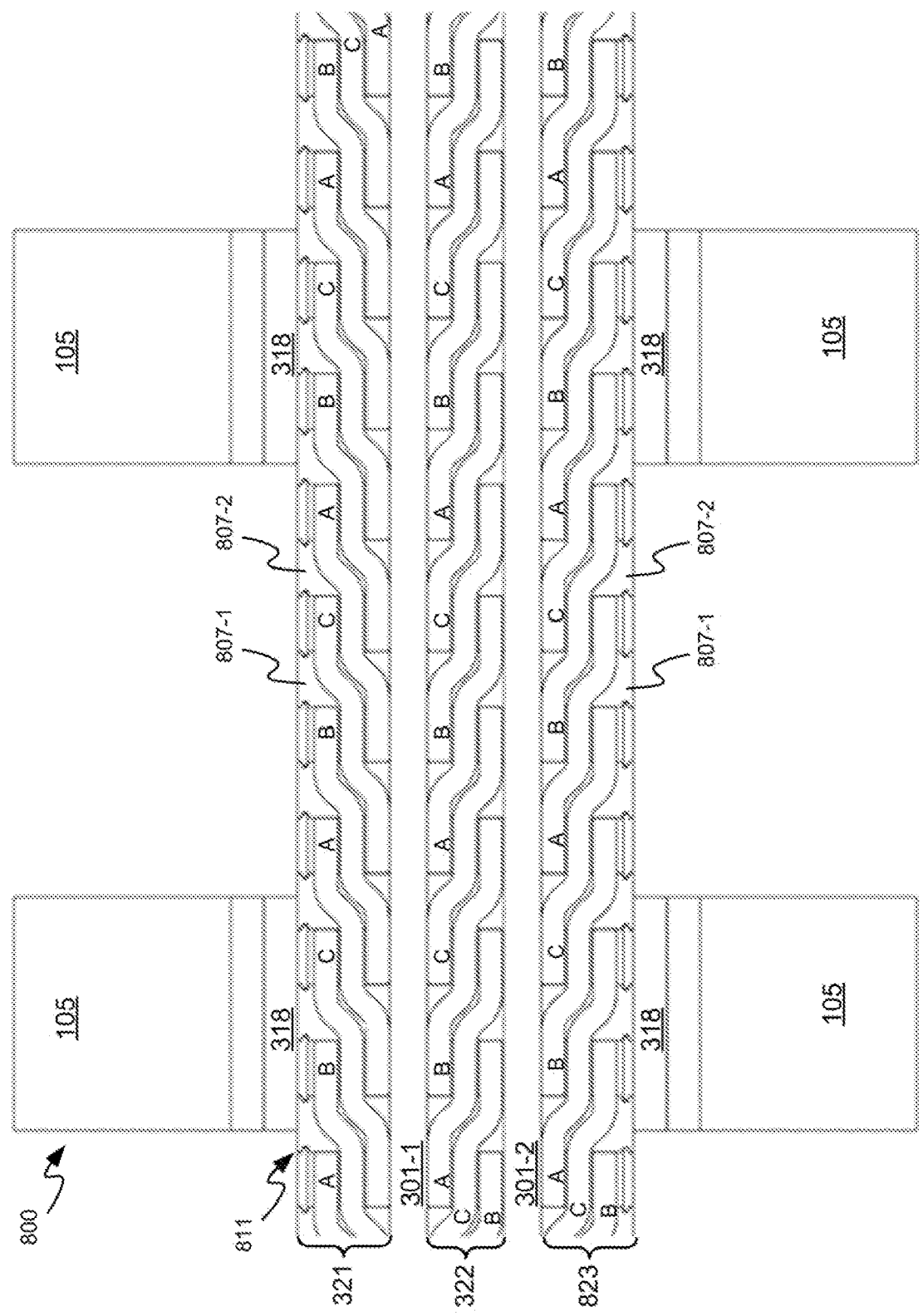

FIG. 8 depicts a side view of a portion of a mover device that includes a plurality of cold plates and a plurality of layers of armature coils, according to non-limiting examples.

Figure 9:
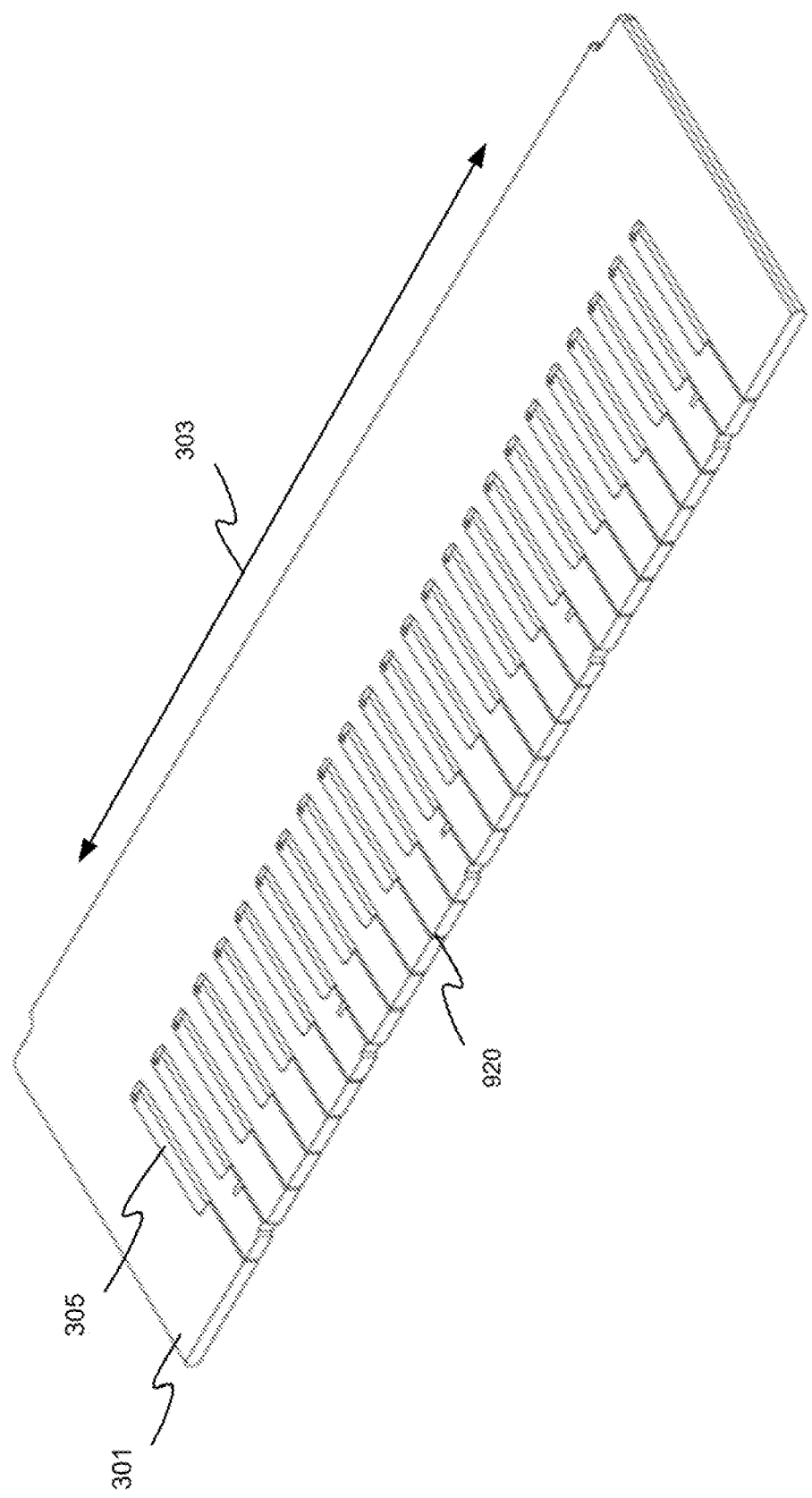

FIG. 9 depicts details of a cold plate, according to non-limiting examples.

Figure 10A:
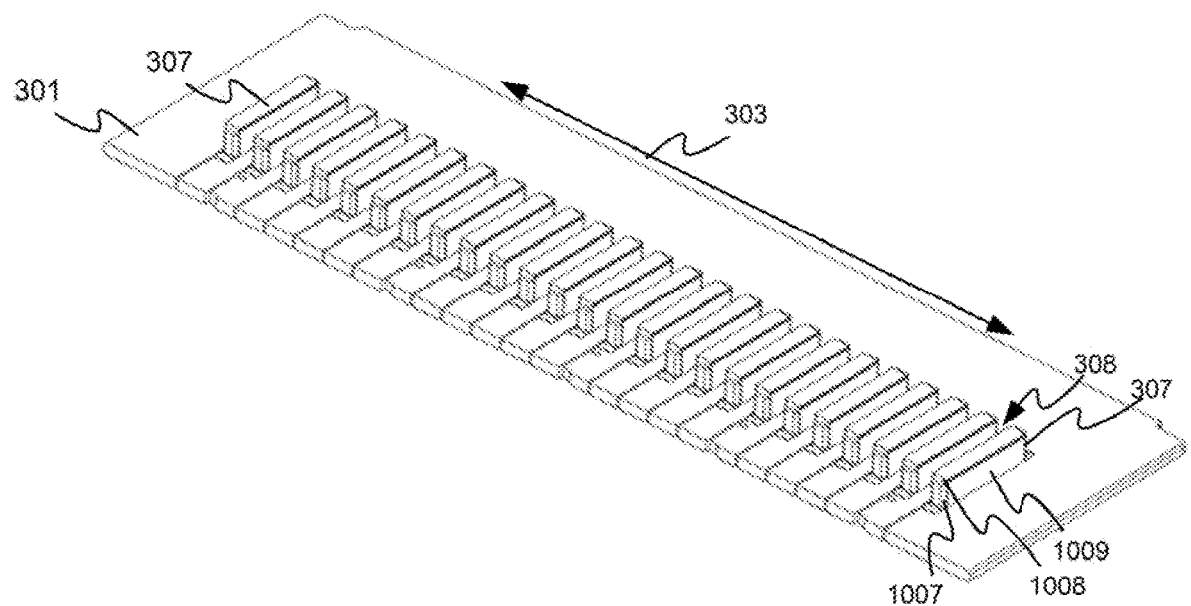
Figure 10B:
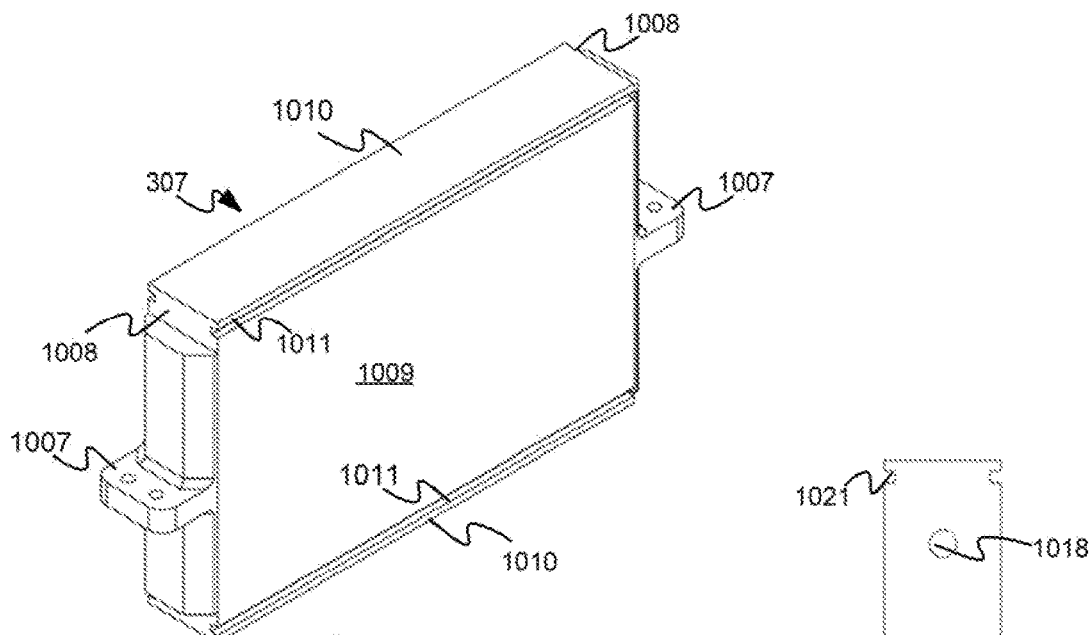
Figure 10C:
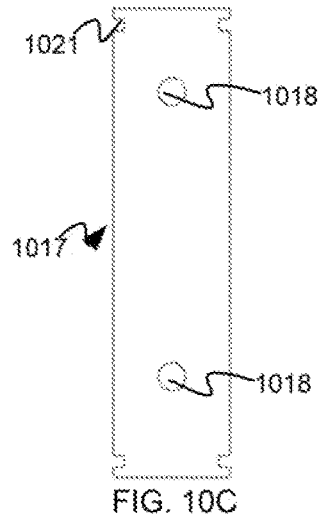

FIG. 10A, FIG. 10B and FIG. 10C depict details of a ferromagnetic core, according to non-limiting examples.

Figure 11A:
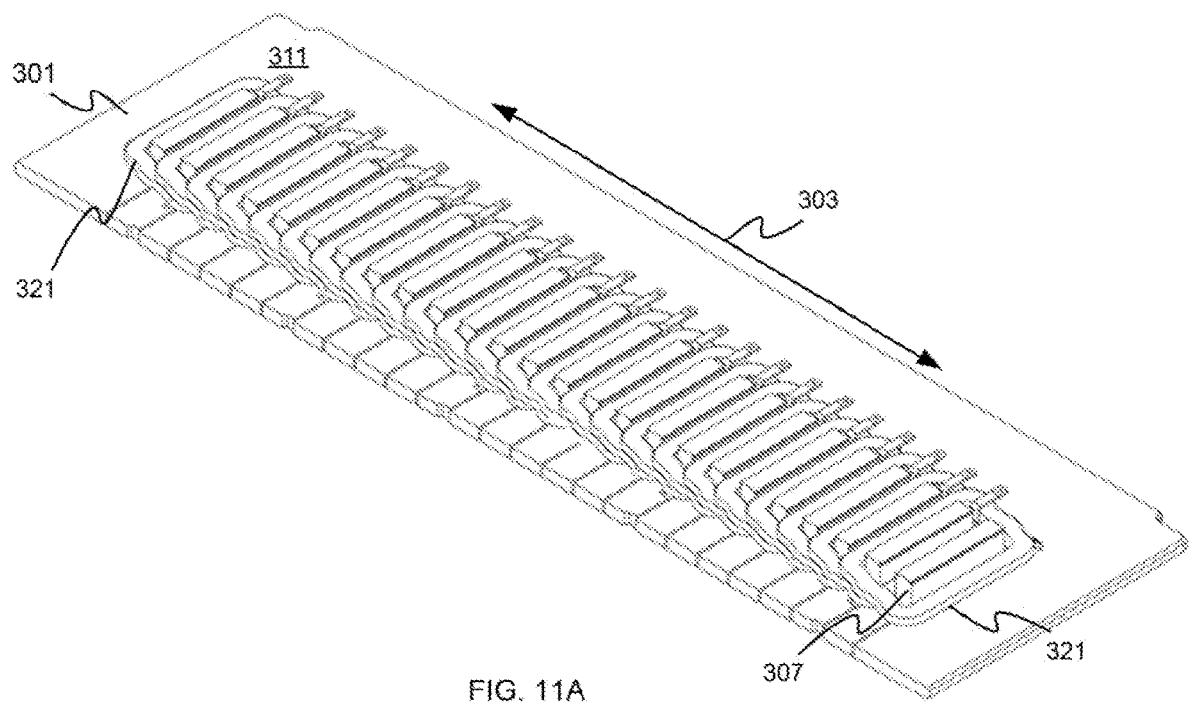
Figure 11B:
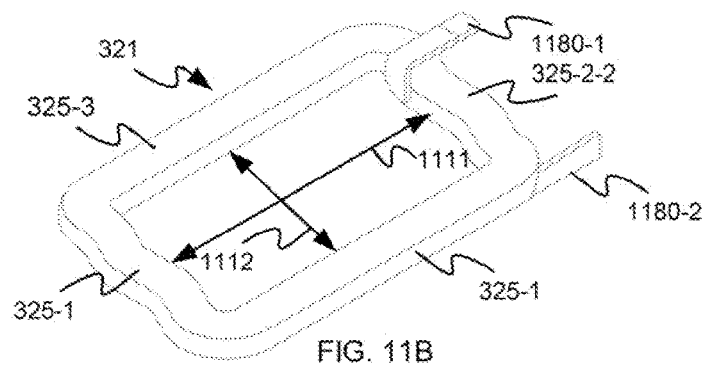
Figure 11C:
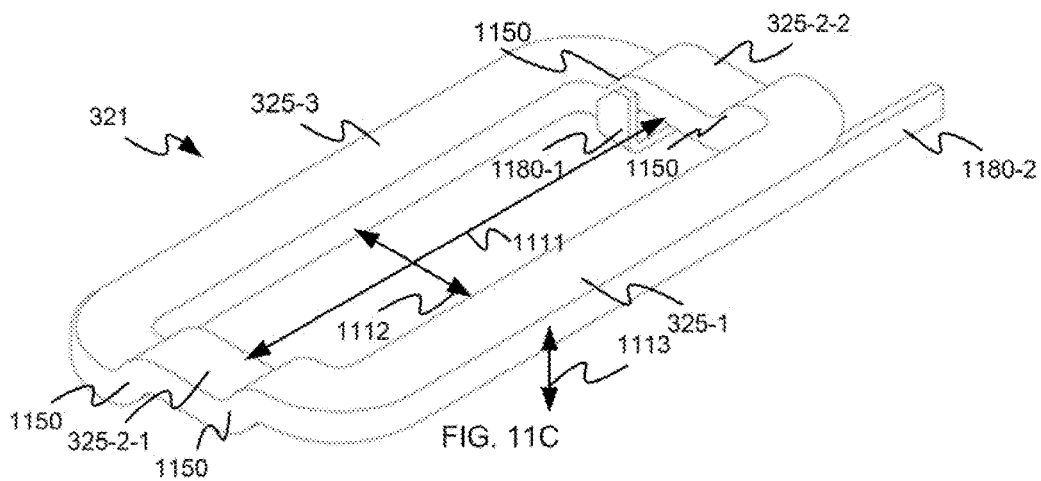

FIG. 11A, FIG. 11B and FIG. 11C depict details of a stepped armature coil, according to non-limiting examples.

Figure 12A:
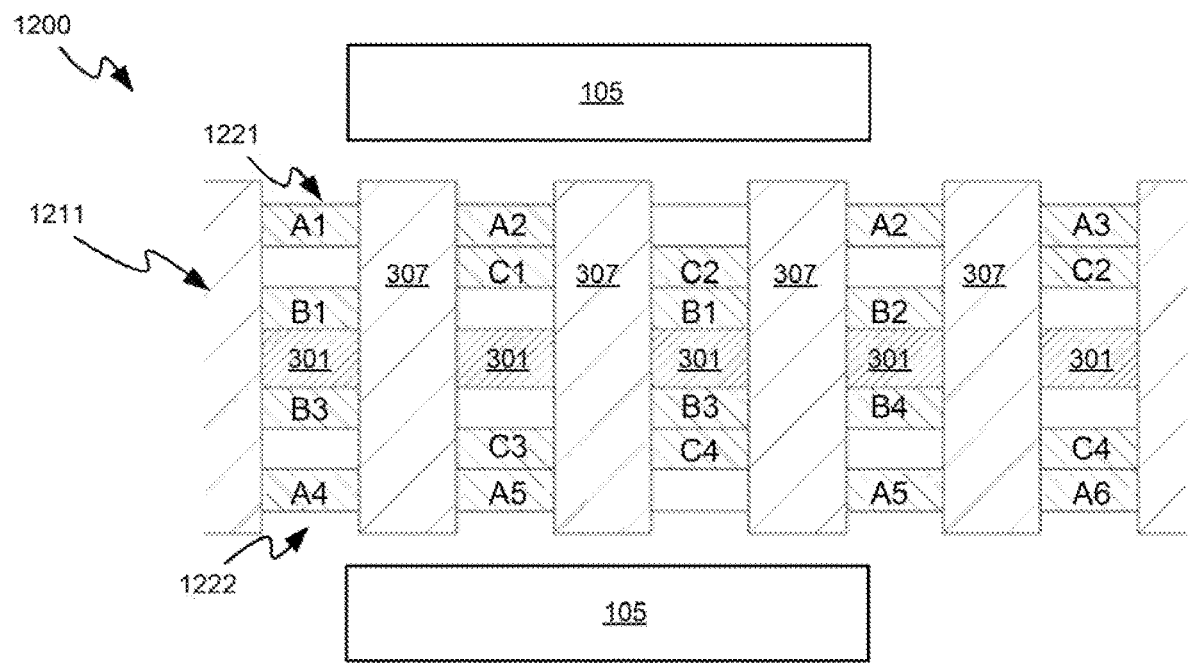
Figure 12B:
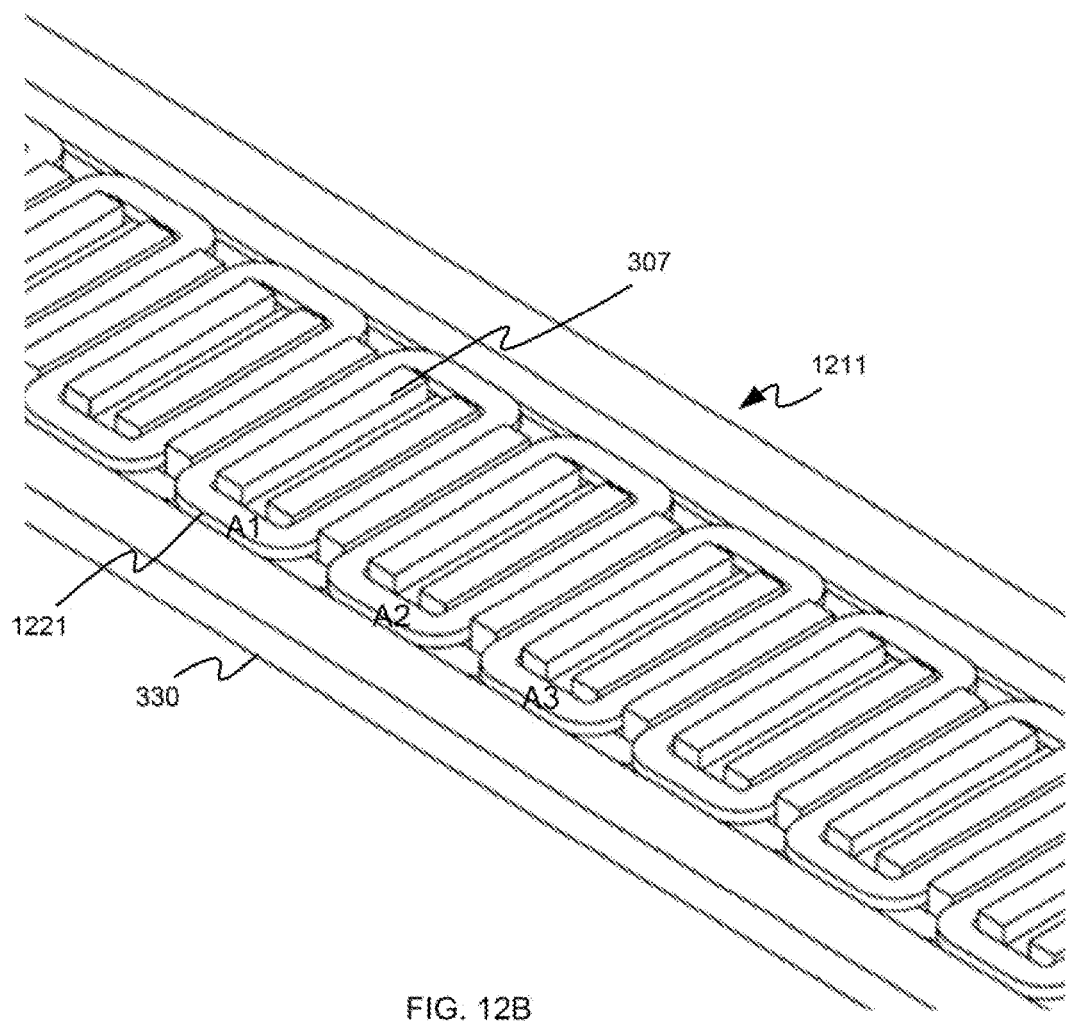

FIG. 12A and FIG. 12B depict details of a mover device that includes 3-layer integer windings with a ⅔ short pitch, according to non-limiting examples.

Figure 13A:
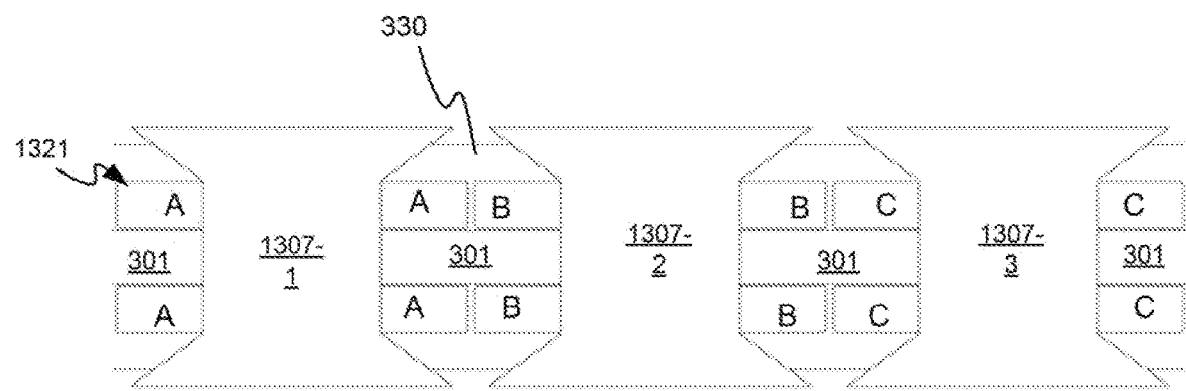
Figure 13B:
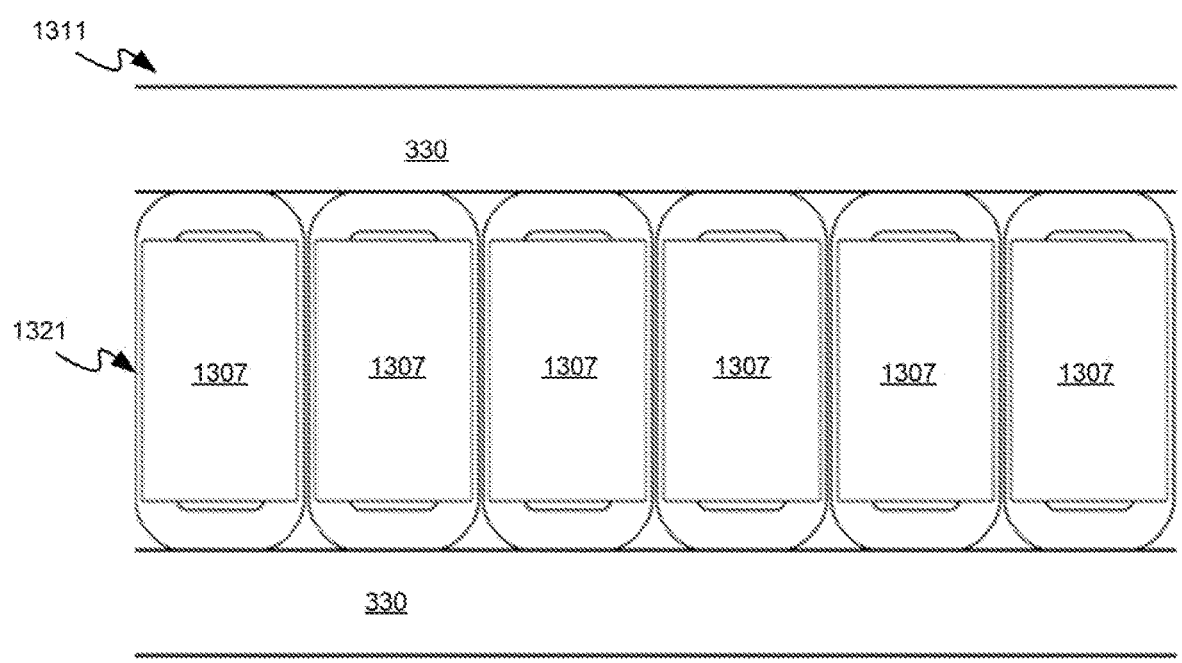

FIG. 13A and FIG. 13B depict details of a mover device that includes fractional slot concentrated winding armature coils, according to non-limiting examples.

Figure 14A:
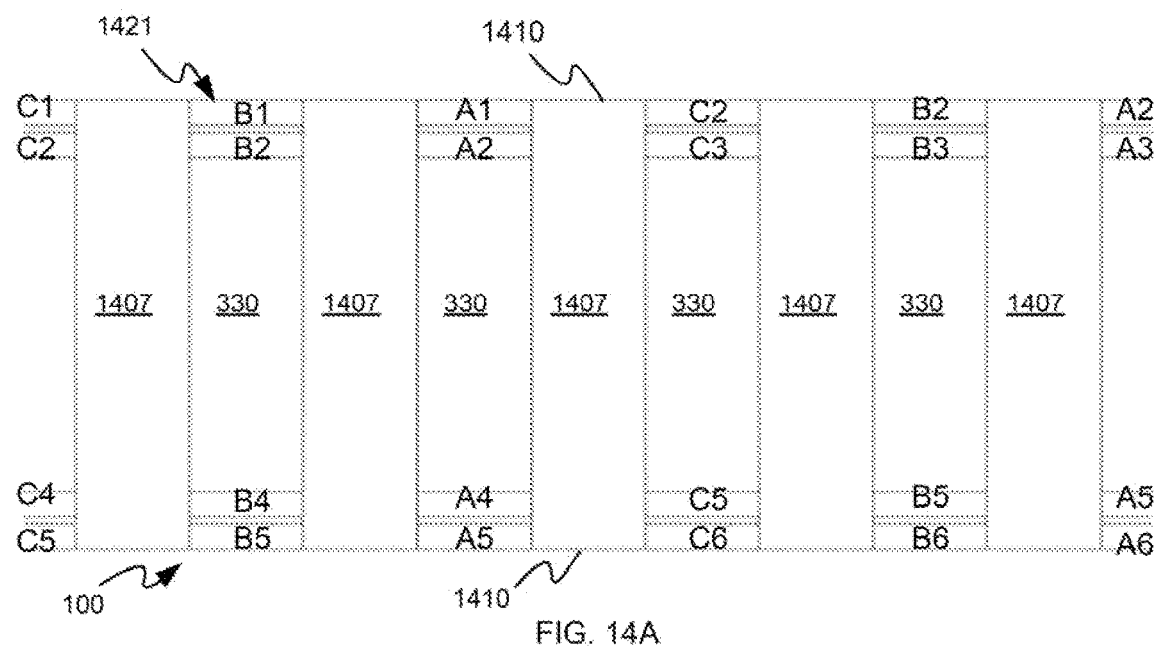
Figure 14B:
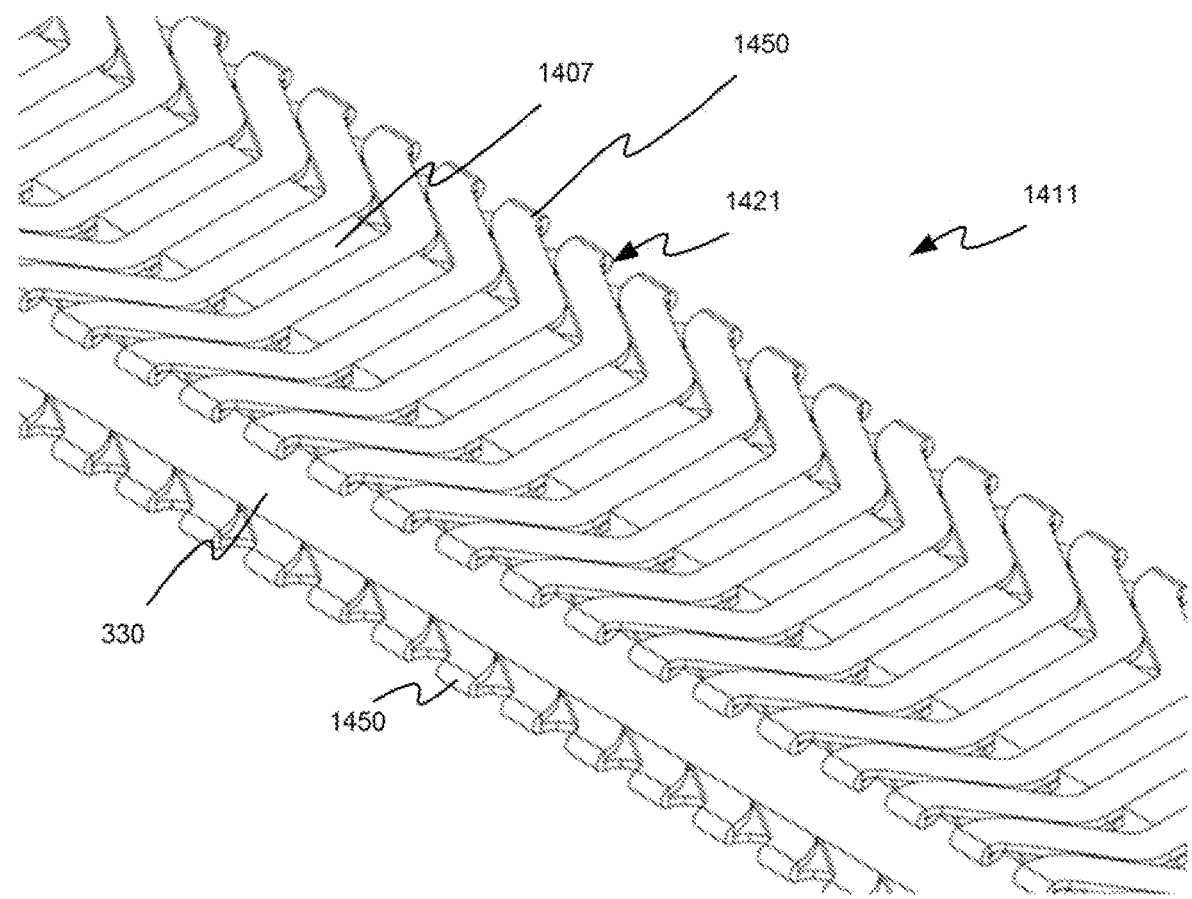

FIG. 14A and FIG. 14B depict details of a mover device that includes diamond armature coils, according to non-limiting examples.

Figure 15:
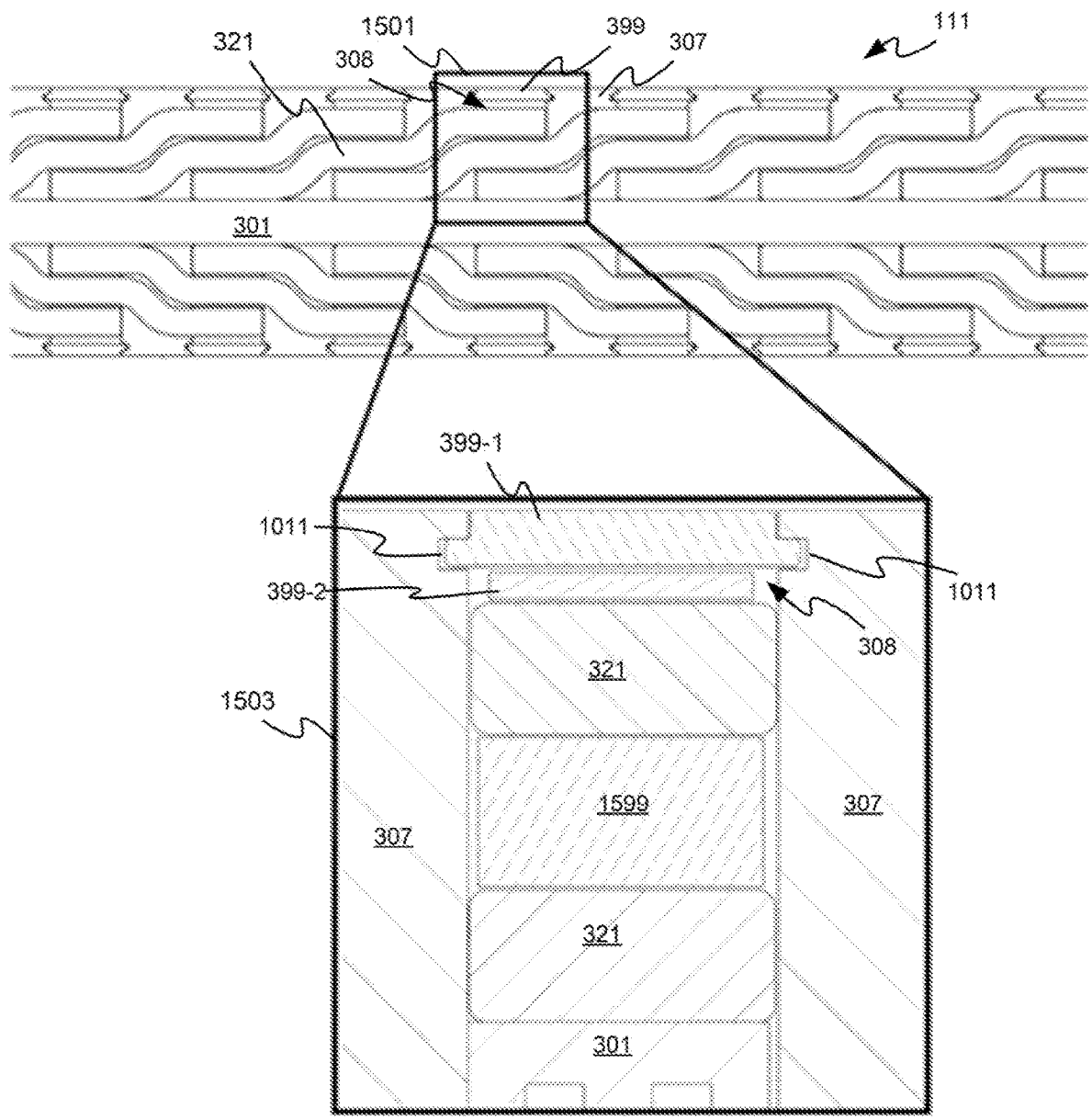

FIG. 15 depicts details of retention devices and cooling blocks of a mover device, according to non-limiting examples.

Figure 16:
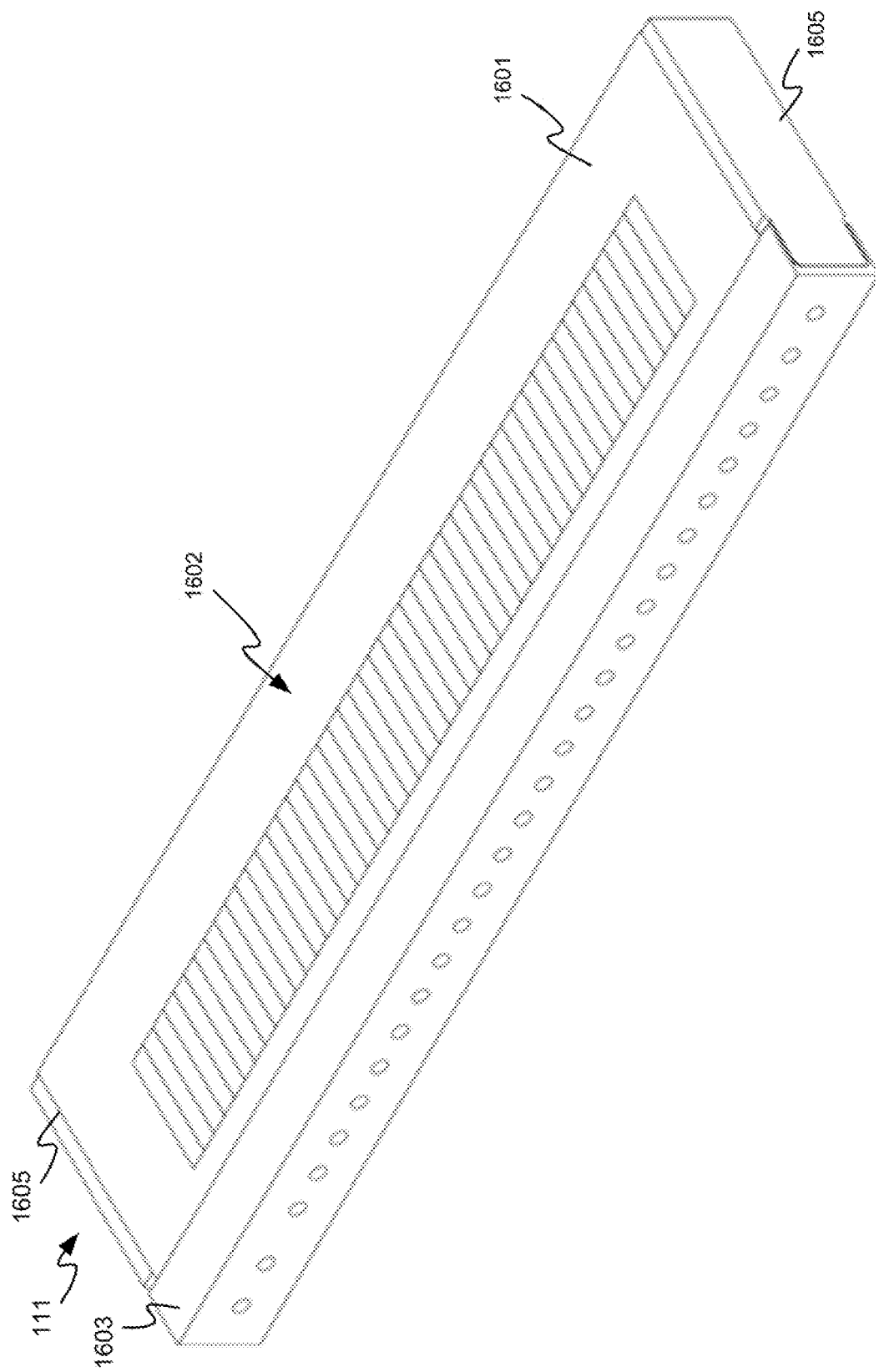

FIG. 16 depicts a mover device in an assembled state, according to non-limiting examples.

Figure 17:
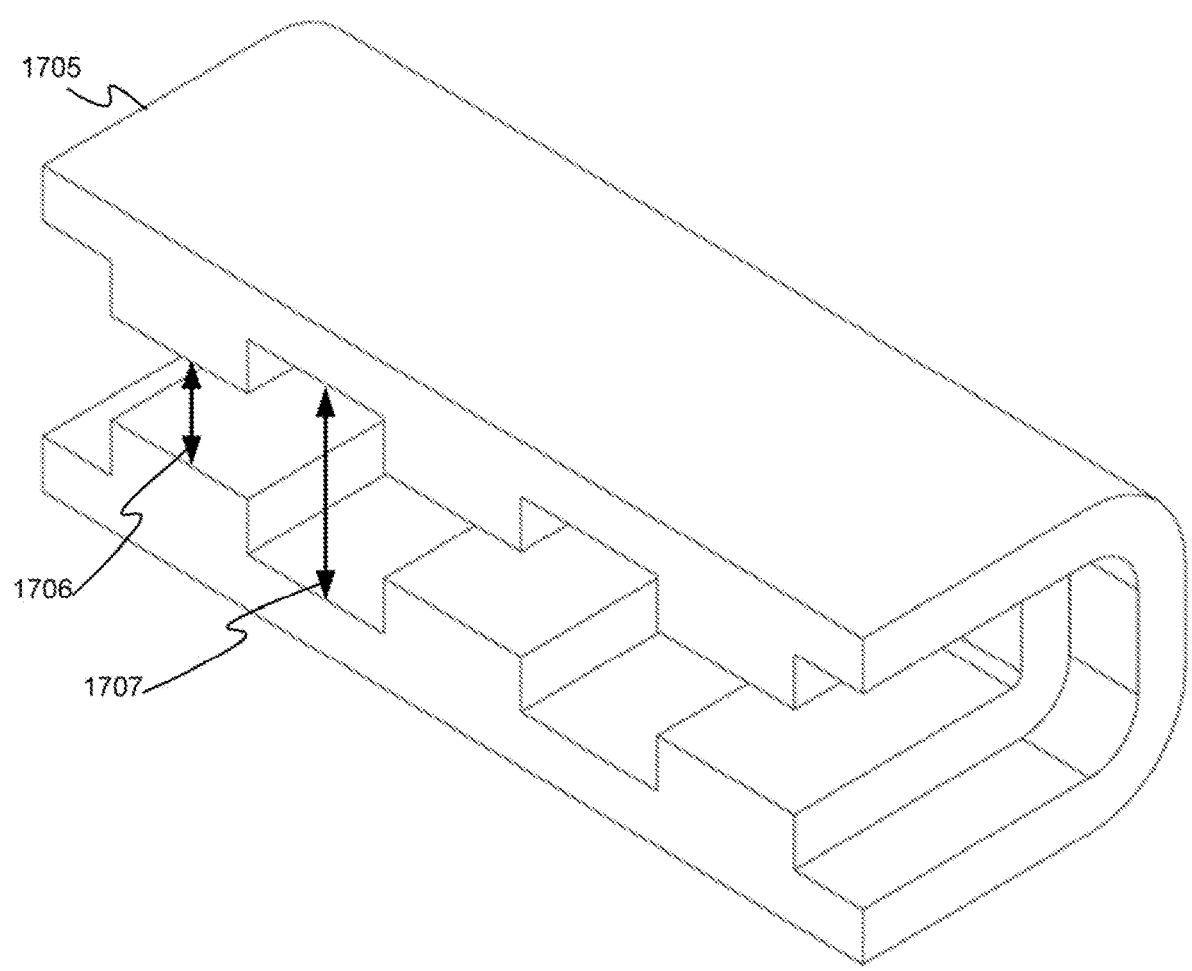

FIG. 17 depicts an elongated C-shaped channel having magnetic saliency, and which may be used as track for a mover device, according to non-limiting examples.

DETAILED DESCRIPTION

Throughout the present specification, references to a "stator" may refer to a track and/or channel segments of a homopolar linear synchronous machine used in a transportation system, described herein, and references to a "rotor" may refer to components of a mover device, of the homopolar linear synchronous machine, which interact with the track to propel the mover device along the track in the transportation system.

In particular, an aspect of the present specification provides a homopolar linear synchronous machine for a transportation system. A homopolar linear synchronous machine may include a stator (e.g. a track) and rotor (e.g. a mover device). The rotor may include at least one armature winding which may be in the form of an armature coil and/or armature coils. Indeed, as used herein, a winding may comprise a coil, more than one coil and/or a plurality of coils. The armature coil(s) may form a flux path with an adjacent track segment. The rotor may have a ferromagnetic core which may be laminated. The armature winding may be around the ferromagnetic core. The rotor may be paired with a stator, which may include a track that includes at least one channel, and which may be formed from channel segments. The rotor may have a field winding, for example in the form of a field coil and/or field coils, around the core laterally, such that in the presence of the track, a field flux path through the path geometry is formed.

Another aspect of the present specification provides a system with a moveable rotor and a relatively fixed stator such that the two together form a homopolar linear synchronous machine. The rotor may include at least one coil, at least one core, and at least one cold plate. A core may be constructed from a ferromagnetic material, such as silicon steel, cobalt steel and the like. A core may be laminated, such that the core is constructed from at least two sheets of metal that have been joined together while remaining electrically insulated from each other using, for example, one or more of surface roughness, blueing, coatings, and the like. The laminations of the core may be grain oriented and/or non-grain oriented. A cold plate may include a rectangular sheet of aluminum and/or a rectangular sheet of stainless steel, and the like. The cold plate may have cooling channels for removing heat. The cold plate may also serve as the main structural unit of the rotor. The cold plate may have substantially parallel slots through the cold plate, which may be interchangeably referred to as windows and/or apertures through the cold plate. The slots may be rectangular in shape and/or the slots may be complementary to a shape of a core.

The core may be joined to the cold plate, such that the core fits substantially within a slot of the cold plate and the core may be substantially connected to the cold plate in any suitable manner, such as mounting brackets. A portion of the core may extend beyond at least one face of the cold plate, such that when viewed down the length of the cold plate, the core may be visible extending out from at least one side of the cold plate. Another aspect of the present specification provides a plurality of cores which may be joined to the cold plate. Another aspect of the present specification provides a second core which may be attached to a cold plate in a location that is offset from a first core, such that the second core and the first core are substantially parallel. The at least one winding may include an armature winding and/or armature coil(s), and a field winding and/or field coil(s). The winding may be made from a conductive material, such as aluminum, copper, and the like, and a coil of a winding, as well as turns thereof, may be coated in an insulating material, such as polyamide enamel, polyamide tape, and the like. Another aspect of the present specification provides a rotor which may include a field winding that is oriented such that the field winding is substantially entirely along the outer perimeter of a face of the cold plate. Another aspect of the present specification provides a rotor which may include at least one armature winding, wherein a loop and/or coil formed by the armature winding has a face that is oriented substantially parallel to a face of the cold plate. The armature winding may be located substantially on an outer face of the core. Another aspect of the present specification provides an armature winding which may include at least one armature coil. Another aspect of the present specification provides a rotor with armature coils on the length of the rotor, wherein groups of armature coils may represent an electrical phase of multi-phase electrical device and/or system. Another aspect of the present specification provides a core which may be located such that it is substantially between a first armature coil and a second armature coil (e.g. of one or more armature windings). The armature winding may be substantially enclosed by the field winding, such that the armature winding has a face that is adjacent to a face of the cold plate, within the bounds of the field winding The field winding may be secured to the cold plate using any suitable mechanism, such as stainless steel straps, polytetrafluoroethylene (PTFE) brackets, and the like. The stator may include at least one channel segment made of a ferromagnetic material, such as silicon steel, cobalt steel, and the like. Another aspect of the present specification provides a channel segment which may be laminated such that the channel segment is constructed from at least two sheets of metal that have been joined together while remaining electrically insulated from each other using, for example, one or more of surface roughness, blueing, coatings, and the like. Another aspect of the present specification provides a channel segment which may be substantially "C" shaped, horseshoe shaped, and the like, such that the rotor may be able to pass through the center hollow portion of the channel segment. The stator may include two or more offset channel segments, such that there is a gap between each channel segment, and the channel segments are arranged substantially with the hollow section of each channel segment forming a substantially continuous path for a rotor to move through. The stator may be substantially fixed relative to the rotor.

Another aspect of the present specification provides at least one ripple spring, and/or any other suitable retainer mechanism, which may be used to press the armature windings against the cold plate including, but not limited to a slot wedge. In such examples ripple springs and slot wedges may be used in combination.

Another aspect of the present specification provides armature coils that may be at least partially in contact with the cold plate with a surface area of the armature coils that are exposed to the cold plate being maximized.

Another aspect of the present specification provides armature windings configured as concentrated windings and/or fractional slot concentrated windings, with alternating windings distributed throughout the ferromagnetic core located along a length of the rotor.

Another aspect of the present specification provides armature coils which, when viewed from a cross-section, may be arranged in layers, such that all armature coils of the same phase may be the same distance from a core surface, and armature coils of different phases may be different distances from a core surface. A portion of a first armature coil in a first layer may overlap a portion of a second armature coil that is in a second layer which may provide a short pole pitch as a result.

Another aspect of the present specification provides propulsion of the rotor along a stator track in which wireless charging is incorporated. The use of electromagnetic fields allows for an easy transition into inductor-based charging, allowing a vehicle or other battery to charge as the rotor moves along the stator. Another aspect of the present specification provides charging which may be accomplished by having windings located on the track.

Another aspect of the present specification provides distinct windings and/or coils which may be powered by multiple power sources, such as low power drives, rather than a conventional high power drive supplying power to an entire propulsion system. Each low power drive may be connected to one or more pole pairs.

Another aspect of the present specification provides a cold plate which may include a "toothed" geometry, with gaps and/or slits in any suitable position at the cold plate which interrupts conductive paths to reduce eddy currents in the cold plate. The cold plate may be made of a metal with any suitable thermal and electrical properties such as aluminum, copper, titanium, magnesium, stainless steel, and the like. The armature coils and field coils may be substantially in contact with the cold plate, such that heat is transferred out of the armature coils and field coils and into the cold plate.

Another aspect of the present specification provides a cold plate which may have at least one cooling channel.

Another aspect of the present specification provides a high speed transportation system which includes a homopolar linear synchronous machine. The rotor may be substantially attached to a payload, such as by including bolt holes, brackets, and the like, in the cold plate that may be connected to the payload via respective bolt holes, brackets, and the like, and any suitable fastener, such as bolts, and the like. The payload may be a vehicle, such as for cargo and passengers. Another aspect of the present specification provides a conductive shielding on the rotor to avoid plasma generation. The rotor may be attached to the payload in any of one or more orientations, such as on the top, bottom, and side of the payload, so long as a corresponding stator segment is substantially connected to a surface in an orientation that allows the rotor to pass through a channel segment in the direction of motion. The stator may be attached to a fixed surface, such as a wall and/or an inside of a tube. The stator may be substantially fixed in any orientation, so long as the rotor has a substantially matching orientation to allow the rotor to pass through the channel segment. Another aspect of the present specification provides a high speed transportation system which may be enclosed such that the travelling path may be at least partially evacuated.

Another aspect of the present specification provides a process for using the homopolar linear synchronous machine as a propulsion system for a high-speed transport system in a low-pressure environment. The rotor may be substantially attached to a payload, such as by including bolt holes in the cold plate that may be connected to the payload. The payload may be a vehicle, such as for cargo and passengers. Another aspect of the present specification provides conductive shielding on the rotor to avoid plasma generation. The rotor may be attached to the payload in any of one or more orientations, such as on the top, bottom, and side of the payload, so long as a corresponding stator segment is substantially connected to a surface in an orientation that allows the rotor to pass through a channel segment in the direction of motion. The stator may be attached to a fixed surface, such as a wall and/or an inside of a tube. The stator may be substantially fixed in any orientation, so long as the rotor has a substantially matching orientation to allow the rotor to pass through the channel segment. Power may be passed to the windings of the rotor, introducing a magnetomotive force. The varying magnetic flux comes from the saliency of the channel segments relative to the field winding and/or field coil(s), introducing a field flux path that closes substantially perpendicular to the direction of motion. Thrust may be generated by the interaction between the field flux and the current in the armature winding and/or armature coils.

Another aspect of the present specification provides a mover device comprising: a cold plate comprising a movement axis and slots therethrough arranged along the movement axis; ferromagnetic cores extending through the slots; first armature coils located around the ferromagnetic cores at a first side of the cold plate; second armature coils located around the ferromagnetic cores at a second side of the cold plate opposite the first side of the cold plate; and at least one field coil around one or more of the first armature coils and the second armature coils.

Another aspect of the present specification provides a mover device comprising: one or more cold plates comprising a movement axis and respective slots therethrough arranged along the movement axis; ferromagnetic cores extending through the slots; first armature coils located around the ferromagnetic cores at a first side of a cold plate of the one or more cold plates; second armature coils located around the ferromagnetic cores at a second side of the cold plate, of the one or more cold plates, opposite the first side of the cold plate; and at least one field coil around one or more of the first armature coils and the second armature coils.

Another aspect of the present specification provides a mover device comprising: one or more cold plates comprising a movement axis and respective slots therethrough arranged along the movement axis; ferromagnetic cores extending through the slots; at least a first set and/or first layer of armature coils located around the ferromagnetic cores at a first side of a cold plate of the one or more cold plates; at least a second set and/or second layer of second armature coils located around the ferromagnetic cores at a second side of the cold plate, of the one or more cold plates, opposite the first side of the cold plate; and at least one field coil around one or more of the first set and/or the first layer of the first armature coils and the second set and/or the second layer of the second armature coils.

Another aspect of the present specification provides a mover device comprising: one or more cold plates; a plurality of layers of armature coils, the one or more cold plates and the plurality of layers of armature coils alternating and/or arranged such that a given cold plate is between a pair of layers of armature coils; and a plurality of ferromagnetic cores which extend through respective slots in the one or more cold plates, the plurality of layers of armature coils located around the plurality of ferromagnetic cores with, for example, armature coils of respective phases aligned along the plurality of ferromagnetic cores from layer to layer.

Another aspect of the present specification provides a mover device having any suitable configuration and/or arrangement of cold plates and armature coils. A mover device may include two layers of armature coils with a cold plate therebetween, and a third layer (or more) of armature coils adjacent one (or more) of the two layers of armature coils without a second cold plate, with the armature coils of all three layers of armature coils around common ferromagnetic cores which extend through slots of the cold plate. A mover device may include a first structure comprising two layers of armature coils with a cold plate therebetween, and a second structure comprising two further layers of armature coils with a further cold plate therebetween, slots of the cold plates being aligned, with common ferromagnetic cores extending therethrough; the armature coils of the first structure and the second structure being around the ferromagnetic cores. A mover device may include two or more layers of armature coils with a cold plate therebetween, the armature coils of the two layers around common ferromagnetic cores which extend through slots of the cold plate; the mover device may include additional layers of armature coils around the ferromagnetic cores and/or additional cold plates with respective slots through which the ferromagnetic cores extend.

Figure 1:
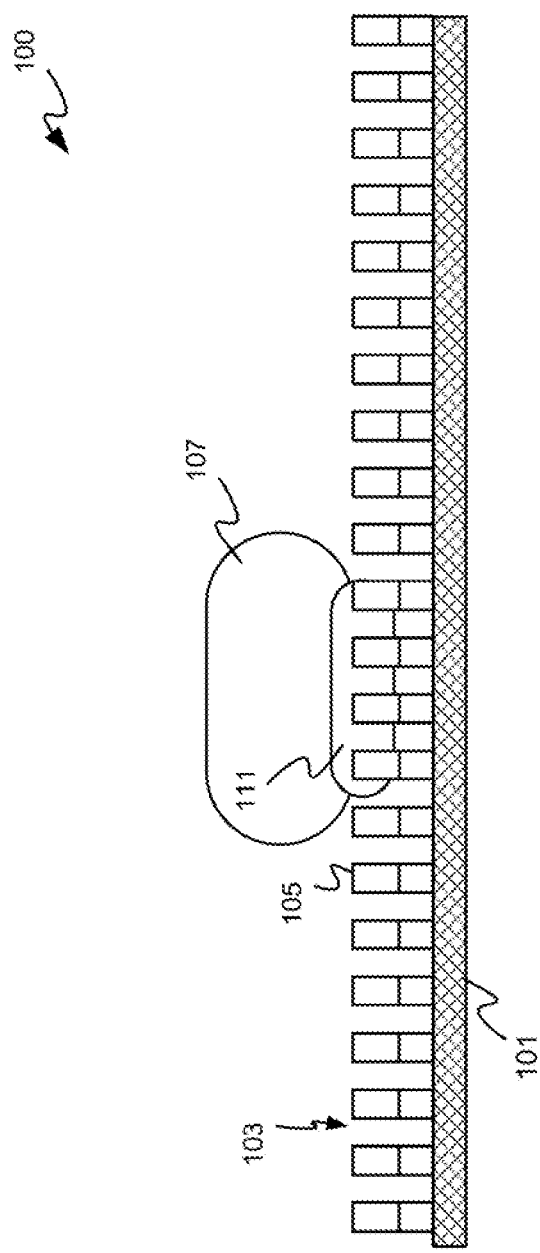
FIG. 1 depicts a view of a high-speed transport system that includes a homopolar linear synchronous motor, according to non-limiting examples.

Attention is directed to FIG. 1 which schematically depicts a view of a high-speed transport system 100. As depicted, the system 100 includes a wall 101 (depicted in cross-section) which supports a track 103 comprising channel segments 105 spaced periodically along the wall 101. In some examples, the wall 101 may be a wall of a tube which may be evacuated and/or at least partially evacuated using vacuum pumps (not depicted) and the like, to form in a low-pressure environment. However, in other examples the tube may not be evacuated and/or the wall 101, the track 103 and the mover device 11 are not in a low-pressure environment. Furthermore, the wall 101 may not be a wall of tube, but may be a wall of any suitable structure which supports the track 103.

As depicted, the system 100 includes a payload 107 which may comprise a vehicle, and the like, for transporting cargo and/or passengers. The payload 107 may be aerodynamically shaped. The system 100 further includes at least one mover device 111 attached to the payload 107 which interact with the channel segments 105 to move the payload 107 along the track 103. Any suitable number of mover devices 111 may be attached to the payload 107 in any suitable configuration. Similarly, the track 103 and the channel segments 105 may be located on one or more sides of a tube, and the like, that include the wall 101, with any geometry of a mover device 111 attached to the payload 107 adjusted accordingly.

In general, the channel segments 105 and the mover device 111, respectively form a stator and a rotor of homopolar linear synchronous machine. The rotors (e.g. the mover device 111) may be substantially attached to the payload 107, such as by including bolt holes and/or attachment units at the mover device 111 that may be connected to the payload 107. The rotor/mover device 111 may include conductive shielding to avoid plasma generation as the payload 107 is propelled along the track 103. The rotor/mover device 111 may be attached to the payload 107 in any of one or more orientations, such as on the top, bottom, and side of the payload 107, so long as a corresponding stator/channel segment 105 is substantially connected to the wall 101 in an orientation that allows the rotor/mover device 111 to pass through a channel segment 105 in a direction of motion. The stator/channel segments 105 may be attached to the wall 101 in any suitable orientation, so long as the rotor/mover device 111 have a substantially matching orientation to allow the rotor/mover device 111 to pass through the stator/channel segments 105.

While not depicted, the system 100 may further comprise a suspension and/or location system to suspend and/or locate the mover device 111 relative to the channel segments 105. Such a suspension and/or location system may be mechanical (e.g. wheels and a track therefor), and/or electromagnetic (e.g. a maglev system), and/or of any other suitable configuration. While not depicted, the system 100 may further comprise a guidance system to guide and/or steer the payload 107 relative to the track 103 and/or the channel segments 105, and/or onto other walls (e.g. of other tubes) that connect to the wall 101

Figure 2:
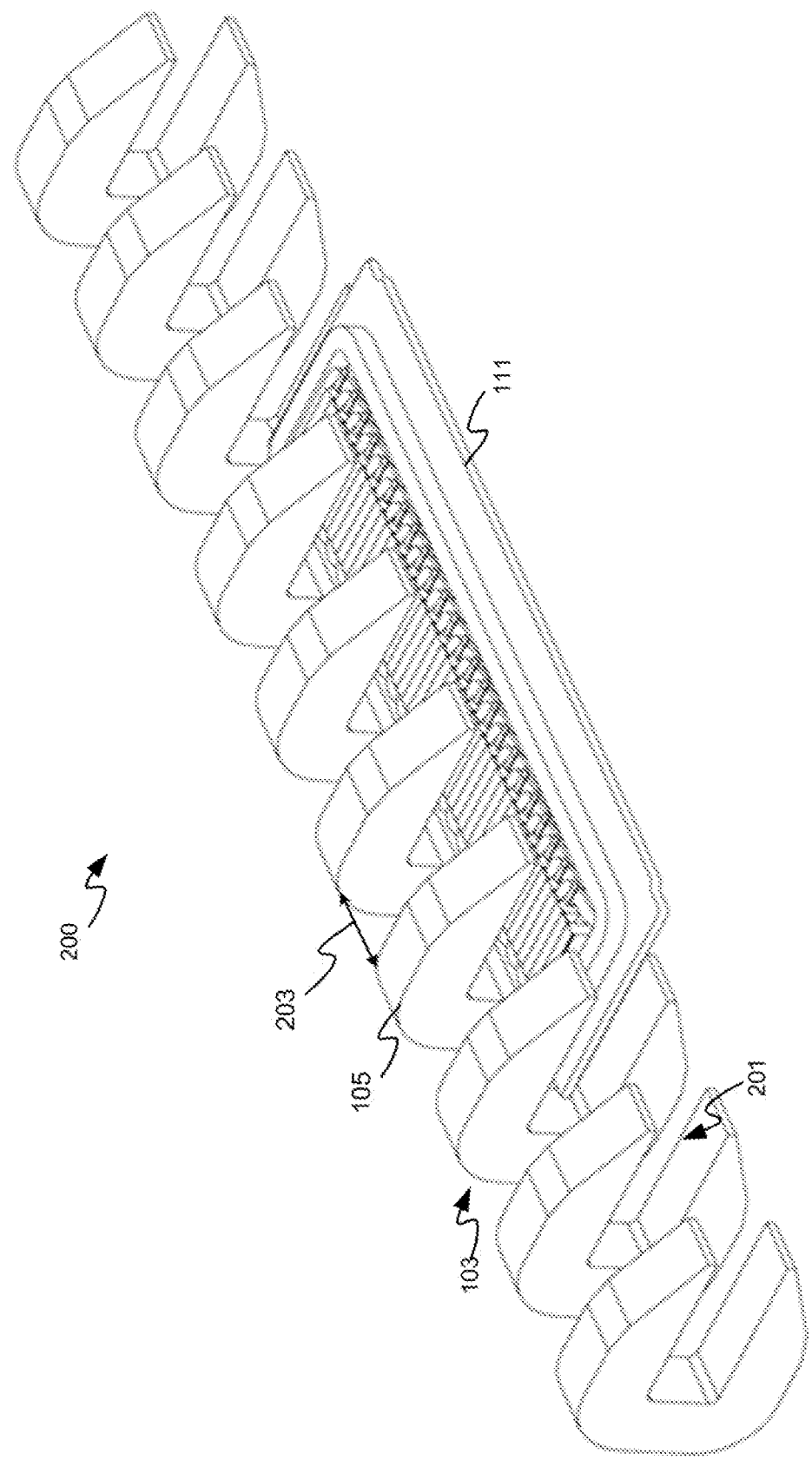
FIG. 2 depicts a perspective view of a homopolar linear synchronous motor, according to non-limiting examples.

Attention is next directed to FIG. 2 which depicts a homopolar linear synchronous machine (HLSM) 200 according to present examples. In particular FIG. 2 depicts a perspective view of a portion of the track 103, including a portion of the channel segments 105 and a mover device 111. As depicted, the channel segments 105 may be substantially C-shaped and/or horseshoe shaped, and the like, such that a mover device 111 may pass through a center "hollow" portion 201 of a channel segment 105. Indeed, as depicted, the mover device 111 is passing through a plurality of channel segments 105. Indeed, as will also be described hereafter, the track 103, and specifically the channel segments 105, may function as a stator of the HLSM 200, and the mover device 111 may function as a rotor of the HLSM 200, such that, together, the track 103 (e.g. the channel segments 105) and the mover device 111 form the HLSM 200.

As depicted, a stator of the HLSM 200, as described herein, may include two or more laterally offset channel segments 105, such that there is a gap 203 between adjacent channel segment 105. Hence, the channel segments 105 are generally magnetically salient, such that a varying magnetic flux may be produced across the channel segments 105 and the gaps 203, for example by at least one field coil of the mover device 111; such magnetic flux may be about constant in a channel segment 105, and the resulting magnetic flux in the gap 203 varies, relative to the flux in a channel segment 105, in a direction of motion (e.g. along the track 103). In some examples, a width of the gap 203 may be similar to a width of a channel segments 105, such that a pitch of the channel segments 105 (e.g. a distance between centers of the channel segments 105) is about twice a width of a channel segment 105 and/or twice a width of the gap 203. However, the pitch of the channel segments 105 may be any suitable value.

The channel segments 105 are arranged such that hollow portions 201 of the channel segments 105 form a substantially continuous path for a rotor, and specifically the mover device 111, to move relative to the channel segments 105 and/or the track 103. Hence, a stator and/or track 103 and/or channel segments 105, may be substantially fixed relative to the rotor/mover device 111 of the HLSM 200. Indeed, together, the track 103 and the mover device 111 comprise a propulsion system for moving the payload 107 relative to the wall 101, in either direction along the track 103, depending, for example, on how field coils and/or armature coils of the mover device 111 are controlled, as described hereafter.

The channel segments 105 may comprise a ferromagnetic material, including, but not limited to, a ferromagnetic metal, silicon steel, cobalt steel and the like. Furthermore, a channel segment 105 may be laminated such that a channel segment 105 comprises (and/or is constructed from) at least two sheets of ferromagnetic material that have been joined together using any suitable lamination process and/or devices (including, but not limited to, bolts and/or fasteners, and the like) while remaining electrically insulated from each other using, for example, one or more of surface roughness, blueing, coatings, and the like. Reference to laminations hereafter are understood to include sheets of electrically conducting material that are electrically insulated from each other using, for example any suitable material and/or process. Such laminations may be used to reduce eddy currents in the channel segments 105; for example, as will be described hereafter, the channel segments 105 generally provide pathways for magnetic flux during operation of the HLSM 200, which generally induce eddy currents which oppose the magnetic flux, and which may be reduced by laminating the channel segments 105, for example in a direction of the hollow portions 201 and/or direction of motion of the mover device 111.

An example of the mover device 111 will next be described with reference to FIG. 3 and FIG. 4 which respectively depict a perspective view of the mover device 111, and a side view of a portion of the mover device 111 located in the hollow portion 201 of two channel segments 105; in FIG. 4, field coils are removed to show details of armature coils and ferromagnetic cores of the mover device 111.

The mover device 111 generally comprises: a cold plate 301 comprising a movement axis 303 and slots 305 (as best seen in outline in FIG. 4) therethrough, from a first side 311 of the cold plate 301 to a second side 312 of the cold plate 301. The second side 312 of the cold plate 301 is opposite the first side 311; the first side 311 is best seen in FIG. 3, and while the second side 312 is not visible in FIG. 3, the second side 312 is understood to be "under" the first side 311 in FIG. 3; as such, the second side 312 is best seen in FIG. 4 in a side view. A side 311, 312 of the cold plate 301 may alternatively be referred to a face of the cold plate 301.

The movement axis 303 comprises an axis in which movement of the mover device 111 may occur, either in a "forward" or "backward" direction, for example along the track 103. When the mover device 111 is rectangular, and/or has a length longer than a width, the movement axis 303 may comprise a longitudinal axis of the mover device 111. Similarly, the movement axis 303 may be along a length of the mover device 111. Put another way, the movement axis 303 generally corresponds to one or more directions of movement of the mover device 111, for example along the track 103, and which may be along a length of the mover device 111.

The slots 305 of the cold plate 301 may generally be rectangular, and parallel with each other, arranged along the movement axis 303. The slots 305 may alternatively be referred to as windows. Put another way, cold plate 301 may have substantially parallel slots 305 removed from the cold plate 301, which may generally reduce a weight of the cold plate 301. However, as will be explained hereafter, the slots 305 and/or window generally provide space for a ferromagnetic core to be mounted to the cold plate 301.

The cold plate 301 is generally configured to remove heat from other components of the mover device 111, and hence may include cooling channels for removing heat, for example via a cooling liquid pumped through the cooling channels.

The cold plate 301 is further generally configured to provide a main structural unit for the mover device 111. In other words, the cold plate 301 generally supports the other components of the mover device 111 and/or the other components of the mover device 111 may be mounted to, and/or may be supported by, the cold plate 301 using mounting brackets and the like, and/or any other suitable fasteners.

The cold plate 301 generally comprise a non-ferromagnetic material including, but not limited to, one or more of aluminum, copper, titanium, magnesium, stainless steel and the like. Furthermore, while the cold plate 301 is depicted herein as a generally rectangular sheet of non-ferromagnetic material (e.g. aluminum, stainless steel, and the like), the cold plate 301 may be of any suitable shape and of any suitable material. Further details of the cold plate 301 are described below with respect to FIG. 9.

The mover device 111 further comprises: ferromagnetic cores 307 extending through the slots 305, which may be in a one-to-one relationship, though there may be more slots 305 than ferromagnetic cores 307. The ferromagnetic cores 307 are generally separated by gaps 308, as best seen in FIG. 4. While for simplicity only one ferromagnetic core 307 is indicated in FIG. 3, and ferromagnetic cores 307-1, 307-2 are indicated in FIG. 4, it is understood that the mover device 111 may include any suitable number of ferromagnetic cores 307, and a corresponding number of slots 305, arranged along the movement axis 303 of the mover device 111. Similarly, while only one gap 308 is indicated in FIG. 4 for simplicity, it is understood that the mover device 111 may include a respective gap 308 between adjacent ferromagnetic cores 307.

A ferromagnetic core 307 may comprise (and/or be constructed from) a ferromagnetic material, including, but not limited to, silicon steel, cobalt steel, and the like. The ferromagnetic cores 307 are generally parallel to each other and arranged along the movement axis 303 of the mover device 111. A shape of the slots 305 is generally complementary to a shape of the ferromagnetic cores 307, and vice versa, such that the ferromagnetic cores 307 fit through the slots 305. Hence, when the slots 305 are rectangular, a cross-sectional shape of the ferromagnetic cores 307, in a plane of the cold plate 301, is also rectangular, and vice versa. However, the slots 305 and the ferromagnetic cores 307 may be of any suitable respective and/or complementary shape.

A ferromagnetic core 307 may be joined to the cold plate 301, such that a ferromagnetic core 307 fits substantially within a slot 305 of the cold plate 301. A ferromagnetic core 307 may be substantially connected to the cold plate 301 in any suitable manner, such as mounting brackets, and the like. A portion of a ferromagnetic core 307 may extend beyond at least one side 311, 312 of the cold plate 301, such that when viewed down a length of the cold plate 301 (e.g. along the movement axis 303), a ferromagnetic core 307 may be visible extending out from at least one side 311, 312. As depicted, a ferromagnetic core 307 extending out from both sides 311, 312 of the cold plate 301.

Put another way, a plurality of ferromagnetic cores 307 may be joined and/or attached to the cold plate 301. For example, a first ferromagnetic core 307 may be joined and/or attached to the cold plate 301, and a second ferromagnetic core 307 joined and/or attached to the cold plate 301 at a location that is offset from the first ferromagnetic core 307, such that the second ferromagnetic core 307 and the first ferromagnetic core 307 are substantially parallel.

Figure 4:
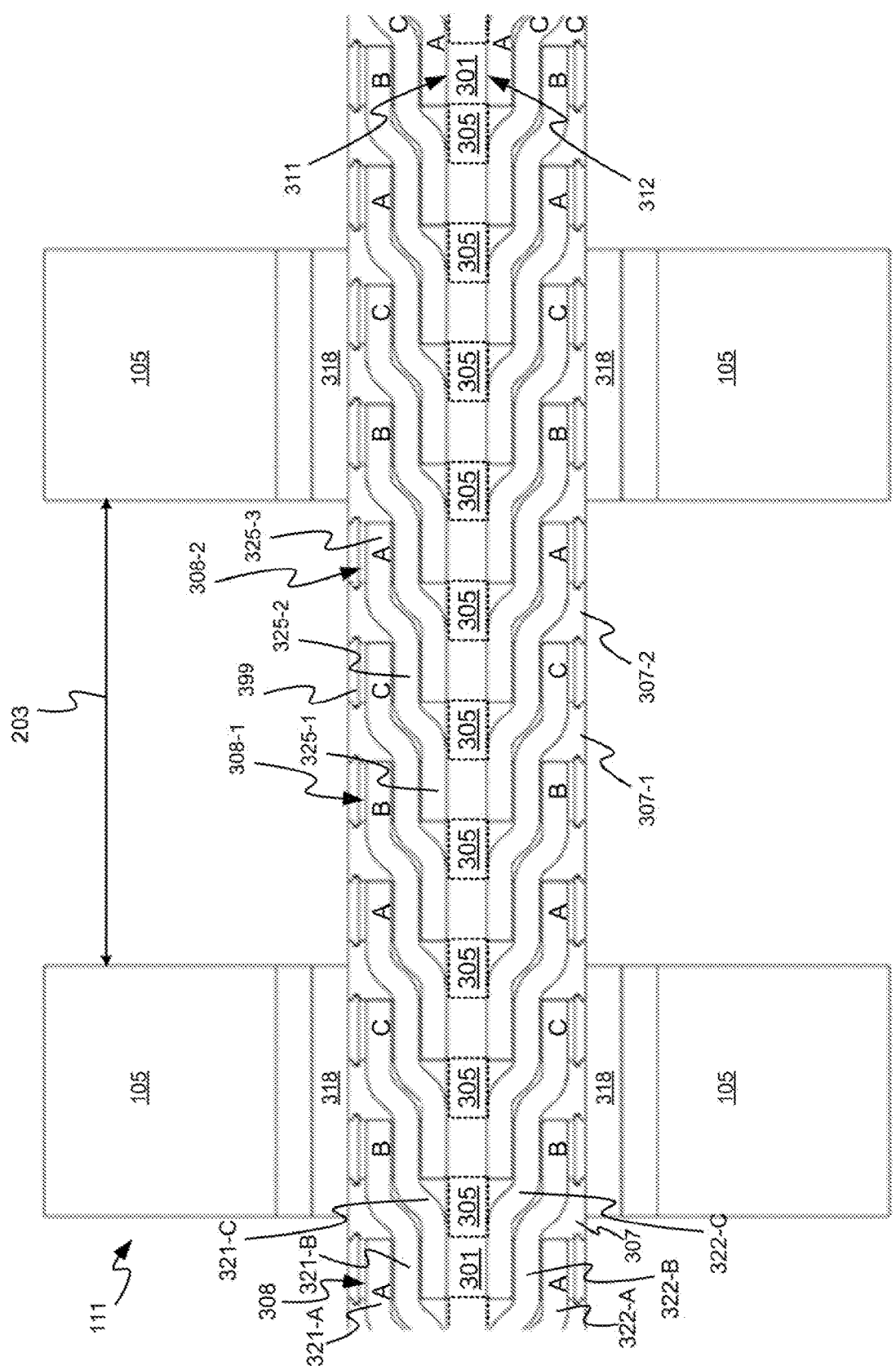
FIG. 4 depicts a side view of a portion of the mover device, with field coils removed, to show armature coils and ferromagnetic cores, as well as channel segments (e.g. a stator) of the homopolar linear synchronous motor, according to non-limiting examples.

In particular, as best seen in FIG. 4, about equal portions of the ferromagnetic cores 307 extend from each of the first side 311 and the second side 312 of the cold plate 301. Put another way, a ferromagnetic core 307 may extend about half way through a respective slot 305 and/or a ferromagnetic core 307 may be about symmetric with respect to the first side 311 and the second side 312 of the cold plate 301.

However, as will be described below, in other examples, a mover device 111 may include more than one cold plate 301 and, in these examples, the ferromagnetic cores 307 extend through all the cold plates 301 through respective slots, with the ferromagnetic cores 307 arranged relative to the cold plates 301 in any suitable manner.

Similar to a channel segment 105, a ferromagnetic core 307 may be laminated such that a ferromagnetic core 307 comprises (and/or is constructed from) at least two sheets of ferromagnetic material that have been joined together using any suitable lamination process and/or devices (including, but not limited to, bolts and/or fasteners, and the like), while remaining electrically insulated from each other as described above. Such laminations may be used to reduce eddy currents in a ferromagnetic core 307; for example, as will be described hereafter, the ferromagnetic cores 307 generally conduct changing magnetic fluxes during operation of the HLSM 200, which generally induce eddy currents, which may be reduced by laminating the ferromagnetic core 307, for example in a direction of the movement axis 303. Furthermore, laminations of a ferromagnetic core 307 may be grain oriented or non-grain oriented; regardless of orientation of grains, the laminations may be produced by a stamping process (and/or any other suitable process) and any suitable stacking process and/or device (e.g. bolts through apertures in the laminations may be used for stacking and/or laminating).

A ferromagnetic core 307 is hence in contact with the cold plate 301 at a respective slot 305; the cold plate 301 may hence generally remove heat from the ferromagnetic cores 307, as well as other components of the mover device 111 as described in more detail below.

As also depicted in FIG. 4, the mover device 111 is generally positioned in the channel segments 105 (e.g. in the hollow portions 201) such that there is a gap 318 between outer surfaces of the mover device 111 and/or the ferromagnetic cores 307, and corresponding sections of a channel segment 105 (e.g. arms of a channel segment 105 which form the hollow portion 201).

Further details of the ferromagnetic cores 307 are described below with respect to FIG. 10A, FIG. 10B and FIG. 10C.

The mover device 111 further comprises: first armature coils 321-A, 321-B, 321-C located around the ferromagnetic cores 307 at the first side 311 of the cold plate; and second armature coils 322-A, 322-B, 322-C (as best seen in in FIG. 4) located around the ferromagnetic cores 307 at the second side 312 of the cold plate 301. Only three of the first armature coils 321-A, 321-B, 321-C, and three of the second armature coils 322-A, 322-B, 322-C are numbered for simplicity, however armature coils 321-A, 322-A are also labelled "A", armature coils 321-B, 322-B are also labelled "B", and armature coils 321-C, 322-C are also labelled "C" in FIG. 4 for clarity. While the armature coils 321, 322 are described as being organized into three groups (e.g. "A", "B" and "C") the armature coils 321, 322 may be organized into any suitable number of groups, for example with each group corresponding to a respective phase of a multiphase electrical device and/or system, as described below. The first armature coils 321-A, 321-B, 321-C are interchangeably referred to hereafter, collectively, as first armature coils 321, and generically as a first armature coil 321; similarly, the second armature coils 322-A, 322-B, 322-C are interchangeably referred to hereafter, collectively, as second armature coils 322, and generically as a second armature coil 322.

Furthermore, it is understood that the first armature coils 321 and the second armature coils 322 may be arranged in respective layers; as such the first armature coils 321 may alternatively and/or interchangeably be referred to as a first layer of armature coils 321, and the second armature coils 322 may alternatively be referred to as a second layer of armature coils 322. Alternatively, and/or in addition to, the first armature coils 321 may interchangeably be referred to as a first set of armature coils 321, and the second armature coils 322 may alternatively be referred to as a second set of armature coils 322.

Furthermore, it is understood that each group of armature coils 321, 322 of a same phase may form a respective armature winding of that phase. Hence, such an armature winding may be distributed on more than one side 311, 312 of the cold plate 301.

The armature coils 321, 322 generally include any suitable conducting material, the like, which form any suitable number of respective closed electrical loops around respective ferromagnetic cores 307. As depicted, each armature coil 321, 322 is located around two ferromagnetic cores 307 (e.g. via respective gaps 308), such that each of the ferromagnetic cores 307 is inside two first armature coils 321, and two second armature coils 322 on either side 311, 312 of the cold plate 301. Such an arrangement may be referred to as a ⅔ short pitch. For example, armature coils 321, 322 may be located substantially at an outer face of a ferromagnetic core 307 in an adjacent gap 308; for example, a ferromagnetic core 307 may include opposing faces in a direction of the movement axis 303 with shorter sides joining the opposing faces, and the armature coils 321, 322 may be around the shorter sides, and along faces of two adjacent ferromagnetic cores 307 through adjacent gaps 308.

An electrical loop formed by an armature coil 321, 322 may have a face that is oriented substantially parallel to a face and/or side 311, 312 of the cold plate 301, at least when viewed from a direction perpendicular to the cold plate 301. As depicted in the example of FIG. 3 and FIG. 4, the armature coils 321, 322 may have a stepped configuration, however the armature coils 321, 322 may have any suitable configuration; examples of other configurations of the armature coils 321, 322 are described in more detail below with respect to FIG. 12A, FIG. 12B, FIG. 13A, FIG. 13B, FIG. 14A, and FIG. 14B.

The armature coils 321, 322 may comprise any suitable conducting material, such as aluminum, anodized aluminum foil, copper, and the like. Further, the conducting material may be insulated using any suitable electrically insulating material including, but not limited to, polyamide enamel, polyamide tape, mica tape, and the like, as well as aluminum oxide of anodized aluminum foil. Any suitable number of the closed electrical loops may be used and may depend on a resistivity of the conducting material.

As depicted, the mover device 111 includes several armature coils 321, 322 along a length of the mover device 111, for example along the movement axis 303. As will be described below, the armature coils 321, 322 may be operated according to different phases of a multi-phase electrical device and/or system. For example, a ferromagnetic core 307 may be located such that it is substantially between (and/or located inside) two first armature coils 321 and two second armature coils 322 (e.g. on either side 311, 312 of the cold plate 301). for example, with reference to FIG. 4, the ferromagnetic core 307-1 is between (and/or located inside) an "A" phase first armature coil 321 and a "C" phase first armature coil 321, at the first side 311 of the cold plate 301. Similarly, the ferromagnetic core 307-1 is between (and/or located inside) an "A" phase second armature coil 322 and a "C" phase second armature coil 322, at the second side 312 of the cold plate 301. Indeed, as depicted, each of the ferromagnetic cores 307 is between (and/or located inside) two adjacent first armature coils 321 at the first side 311, and between (and/or located inside) two adjacent second armature coils 322 at the second side 312; however, in some examples, end ferromagnetic cores 307 along the movement axis 303 may be inside only one first armature coil 321 at the first side 311, and one second armature coil 322 at the second side 312.

The armature coils 321, 322 are generally operated as a multi-phase electrical device and/or system to generate magnetic pole pairs, referred to hereafter as pole pairs, by inducing magnetic flux in the ferromagnetic cores 307, and one or more adjacent channel segments 105, which may generate heat in the armature coils 321, 322. As depicted, at least a portion of the armature coils 321, 322 are in contact with the cold plate 301 such that the cold plate 301 may remove and/or draw heat from the armature coils 321, 322.

The first armature coils 321-B may generally be operated at 120° out of phase with respect to the first armature coils 321-A, and the first armature coils 321-C may be operated at 240° out of phase with respect to the first armature coils 321-A. Similarly, the second armature coils 322-B may be operated at 120° out of phase with respect to the second armature coils 322-A, and the second armature coils 322-C may be operated at 240° out of phase with respect to the second armature coils 322-A. Put another way, adjacent first armature coils 321 may be operated at 120° out of phase with each other, and adjacent second armature coils 322 may be operated at 120° out of phase with each other.

However, the armature coils 321-A, 321-B, 321-C may be operated at any suitable relative phase, and similarly the armature coils 322-A, 322-B, 322-C may be operated at any suitable relative phase, to generate magnetic pole pairs.

Hence, the first armature coils 321 may be operated in sets of three, with every third first armature coil 321, along the movement axis 303 being operated in a same phase. Similarly, the second armature coils 322 may be operated in sets of three, with every third second armature coil 322, in a direction of the movement axis 303 being operated in a same phase. For example, as clearly depicted in FIG. 4, from left to right, the armature coils 321 are in an order of an "A" phase adjacent a "B" phase adjacent a "C" phase, and the then order repeats. The armature coils 322 are arranged in a similar manner.

However, the armature coils 321, 322 may be operated in any suitable number of phases, which may be at least two, or more than three phases, to generate magnetic pole pairs, as described below.

As best seen in FIG. 4, the armature coils 321, 322 may be substantially symmetrical with each other, with respect to the cold plate 301 therebetween. For example, a first armature coil 321 may correspond to a respective second armature coil 322 that is positioned as a mirror image to the first armature coil 321. Put another way, the armature coils 321, 322 may be disposed as pairs along the cold plate 301, with pairs of armature coils 321, 322 being operated at a same phase. For example, an "A" phase armature coil 321 is a mirror image of an "A" phase armature coil 322, etc.

As also best seen in FIG. 4, the first armature coils 321 and the second armature coils 322 comprise stepped armature coils, the stepped armature coils being around two respective ferromagnetic cores 307, with adjacent stepped armature coils 321, 322 offset by one respective ferromagnetic core 307, and steps of the adjacent stepped armature coils stacking with one another.

In present examples, an armature coil 321, 322 may include three steps; with reference to an "A" phase armature coil 321 which is around two adjacent ferromagnetic cores 307-1, 307-2, three steps 325-1, 325-2, 325-3 are depicted.

The first step 325-1 is adjacent the cold plate 301 and runs through a gap 308-1 between two adjacent ferromagnetic cores 307 (e.g. "into" the page of FIG. 4), including the ferromagnetic core 307-1. The first step 325-1 adjacent the cold plate 301 may hence act as a pathway to remove and/or draw heat from an armature coil 321, as well as any components of the mover device 111 in contact with the first step 325-1.

A second step 325-2 is offset from the first step 325-1, towards an outer side of the mover device 111 (e.g. towards the channel segments 105), by an angled portion of the armature coil 321 that is adjacent a short side of the ferromagnetic core 307-1, and which joins the steps 325-1, 325-2. The second step 325-2 is at a gap 308 between the ferromagnetic cores 307-1, 307-2 around which the armature coil 321 is located; unlike the first step 325-1, the second step 325-2 does not run through an adjacent gap 308 and hence may be formed from two portions as best seen in FIG. 11B, described below.

A third step 325-3 is offset from the second step 325-2, towards the outer side of the mover device 111, by a respective angled portion of the armature coil 321 that is adjacent a side of the ferromagnetic core 307-2 and which joins the steps 325-2, 325-3. Similar to the first step 325-1, the third step 325-3 runs through a gap 308-2 between two adjacent ferromagnetic cores 307 (e.g. "into" the page of FIG. 4) and around a face the ferromagnetic core 307-2.

While not visible in FIG. 4, it is understood that the "A" armature coil 321 that includes the steps 325-1, 325-2, 325-3 is similarly shaped on a side of the mover device 111 that is opposite to the depicted side.

Such a stepped configuration may enable the armature coils 321, 322 to be arranged in a compact manner in the mover device 111. For example, as described above, a given ferromagnetic core 307 may have two stepped armature coils 321 located around it (with a stepped armature coil 321 being located around two respective ferromagnetic cores 307, the two stepped armature coils 321 configured to operate at different respective phases).

In particular, adjacent stepped armature coils 321 may be offset from one another and "stacked" via the steps, such that steps of adjacent stepped armature coils 321, closest to the cold plate 301, are each adjacent the cold plate 301, and steps closest to an outer surface of the mover device 111, are each adjacent the outer surface of the mover device 111. Put another way, the first steps, second steps and third steps of stepped armature coils 321 are located in respective planes about parallel to the cold plate 301, with a plane of the first step being closest to the cold plate, a plane of the third step being closest to an outer surface of the mover device 111, and a plane of the second step being about midway between the planes of the first steps and the third steps. Respective angled portions generally join the first step to the second step, and the second step to the third step. Stepped armature coils 322 may be similarly described.

Furthermore, as mentioned above, steps of the armature coils 321, 322 that are adjacent the cold plate 301 (e.g. the step 325-1) may be at least in partial contact with the cold plate 301 to remove heat therefrom. Indeed, a surface area of such the steps and/or the armature coils 321, 322 adjacent the cold plate 301 may be maximized, to maximize surface area of the armature coils 321, 322 that are exposed to, and/or in contact with, the cold plate 301.

Further details of the stepped armature coils 321, 322 are described below with respect to FIG. 11A, FIG. 11B, 11C and FIG. 15.

Operation of the armature coils 321, 322 will be described in more detail below with respect to FIG. 5A, FIG. 5B, FIG. 6 and FIG. 7.

Figure 3:
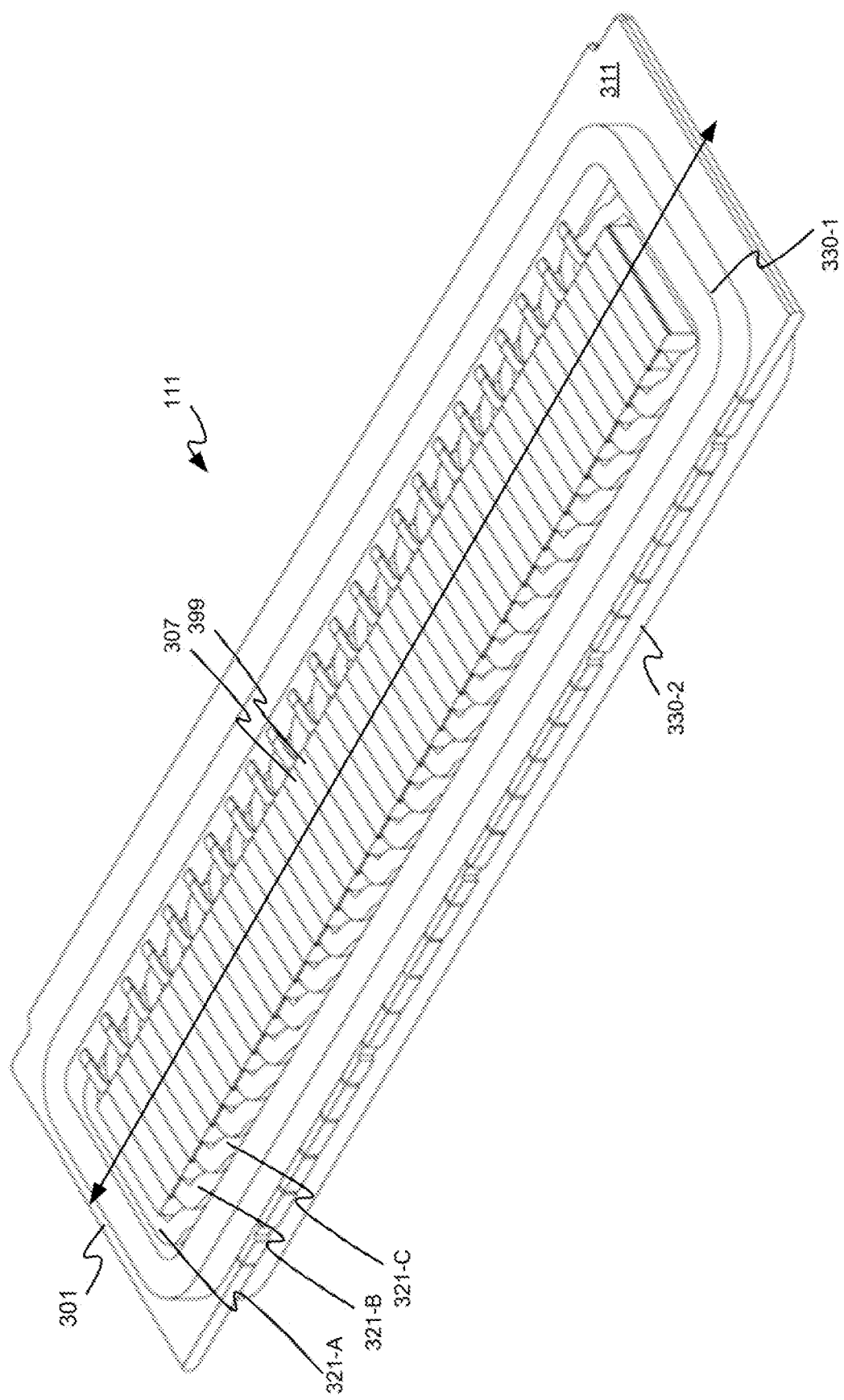
FIG. 3 depicts a perspective view of a mover device (e.g. a rotor) of a homopolar linear synchronous motor, according to non-limiting examples.

With further reference to FIG. 3 and FIG. 4, the mover device 111 further comprises: at least one field coil 330-1, 330-2 (as best seen in FIG. 3), around one or more of the first armature coils 321 and the second armature coils 322.

For example, as depicted, the mover device 111 comprises a first field coil 330-1 around the first armature coils 321 at the first side 311 of the cold plate 301, and a second field coil 330-2 around the second armature coils 322 at the second side 312 of the cold plate 301. The field coils 330-1, 330-2 will be interchangeably referred to hereafter, collectively, as the field coils 330 and, generically, as a field coil 330.

While two field coils 330 are depicted, the mover device 111 may comprise as few as one field coil 330, for example at one side 311, 312 of the cold plate 301. However, the mover device 111 may comprise any suitable number of field coils 330, including, but not limited to, more than two field coils 330.

A field coil 330 generally comprises wire and/or other suitable conducting material (e.g. such as a metal foil) which form any suitable number of closed electrical loops. An electrical loop formed by a field coil 330 may have a face that is oriented substantially parallel to a face and/or side 311, 312 of the cold plate 301. The field coil 330 may comprise any suitable conducting material, such as aluminum, anodized aluminum foil, copper, and the like. Further, the conducting material may be insulated using any suitable electrically insulating material including, but not limited to, polyamide enamel, polyamide tape, mica tape, and the like, as well as aluminum oxide of anodized aluminum foil. Any suitable number of the electrical loops may be used and may depend on a resistivity of the conducting material.

As will be explained hereafter, a field coil 330 is generally operated to form a loop of magnetic flux about perpendicular to the cold plate 301, which may generate heat in a field coil 330. Hence, as depicted, each field coil 330 may be located at least partially against the cold plate 301, which may remove heat from a field coil 330.

In some examples, as depicted, a field coil 330 may be oriented such that the field coil 330 is substantially entirely along an outer perimeter of a face and/or side 311, 312 of the cold plate 301.

Furthermore, an armature coil 321, 322 (and/or armature windings formed by the armature coils 321, 322) may be substantially enclosed by a field coil 330, such that an armature coil 321, 322 has at least one portion that is adjacent to a face and/or side 311, 312 of the cold plate 301, within a bounds of the field coil 330. The field coil 330 may be secured to the cold plate 301 in any suitable manner, such as stainless steel (e.g. non-ferromagnetic) straps, polytetrafluoroethylene (PTFE) brackets, and the like.

Hence, in general, a rotor/mover device 111 of the HLSM 200 provided herein may include at least one winding, which may include an armature winding (e.g. as formed by the armature windings 321, 322) and a field winding (e.g. as formed by the at least one cold plate 301); an armature winding (e.g. as formed by the armature windings 321, 322) and a field winding (e.g. as formed by the at least one cold plate 301) may be controlled independently, as described in more detail below with respect to FIG. 7.

Also depicted in FIG. 3 and FIG. 4 are retention devices 399 of the mover device 111, for example at respective gaps 308. The retention devices 399 are generally to retain the first armature coils 321 and the second armature coils 322 between the ferromagnetic cores 307 and may comprise one or more of a wedge and/or a slot wedge, a ripple spring, and the like. Further details of the retention devices 399 are described below with respect to FIG. 15.

The mover device 111 may include any other suitable components. For example, as described below with respect to FIG. 15, the mover device 111 may comprise one or more spacer blocks between the ferromagnetic cores 307 and between respective armature coils 321, 322 located around the ferromagnetic cores 307, the one or more spacer blocks configured to conduct heat from one or more of the ferromagnetic cores 307 and the respective armature coils 321, 322 to the cold plate 301. For example, spacer blocks may be located in the gaps 308 between first and third steps of adjacent armature coils 321 (and/or adjacent armature coils 322) to fill a space therebetween and provide heat conduction therebetween. However, spacer blocks may be located in any suitable position and/or gap of the mover device 111.

In some examples, at the mover device 111, at least a portion of one or more of the cold plate 301, the ferromagnetic cores 307, the first armature coils 321 the second armature coils 322, and the field coil(s) 330 may be encapsulated using an electrically insulating material (which may, in some examples, be vacuum compatible), for example to provide a surface to apply shielding, increase thermal performance, provide electrical insulation for any exposed electrical part (e.g. busbars of the armature coils 321, 322 as described in more detail below with respect to FIG. 11A. 11B and 11C), electrical insulation, increase mechanical stiffness, increase durability, and the like. In some of these examples, the mover device 111 may further comprise a reinforcement member, which may be external to the electrically insulating material, and/or internal to the mover device 111, and which runs along any suitable edge of the cold plate 301, including but not limited to, an edge of the cold plate 301 to which slits extend from the slots 305 (e.g. to reduce eddy currents in the cold plate) as described in more detail below with respect to FIG. 9. A reinforcement member is described in more detail with respect to FIG. 16.

In yet further examples, the mover device 111 may be at least partially clad with conductive shielding to avoid plasma generation as the mover device 111 moves through the wall 101, for example to contain electric fields within the mover device 111; for example such conductive shielding may be at an outside of the electrically insulating material.

Attention is next directed to FIG. 5A and FIG. 5B which respectively depict a side and cross-sectional view of a portion of the HLSM 200 including a portion of the mover device 111 and two channel segments 105, along with magnetic flux paths that occur during operation of the HLSM 200. In FIG. 5A, the mover device 111 is again depicted without the field coils 330 to show the armature coils 321, 322.

FIG. 5A and FIG. 5B depict respective loops 501 of magnetic flux produced by electrical current flowing through the field coils 330, for example through each of the channel segments 105, gaps 318, and one or more respective ferromagnetic cores 307 located in a hollow portion 201 of a channel segment 105. In particular, FIG. 5B is through a cross-section of the portion of the mover device 111 of FIG. 5A through which a loop 501 of magnetic flux is depicted.

Hence, as best seen in FIG. 5B, due to the "C" shape of the channel segment 105, and one or more of the ferromagnetic cores 307 being in the hollow portion 201, a loop 501 of the magnetic flux forms a closed loop around a channel segment 105 through one or more of the ferromagnetic cores 307. In particular, a loop 501 of magnetic flux flows along a d-axis (e.g. a "direct" direction) at about a center of a channel segment 105. A d-axis is similar to a d-axis of "dq" concepts used to describe field-oriented control of electric machines and/or rotary machines.

A loop 501 of magnetic flux is generally about perpendicular to the movement axis 303 of the mover device 111. Put another way, a field flux path (e.g. a path and/or a loop 501 of magnetic flux produced by the field coils 330) closes substantially perpendicular to a direction of motion of the mover device 111. While the loops 501 of magnetic flux are depicted as lines, it is understood that the magnetic flux that forms the loops 501 has a three-dimensional shape, a cross-section of which is depicted in FIG. 6 below.

FIG. 5B further depicts a cross-sectional shape of a channel segment 105, which may be chamfered to remove mass therefrom and to generally reduce weight of a channel segment 105. Suitable chamfering and/or a suitable shape of a channel segment 105 may be further selected to shape a loop 501 of magnetic flux, and/or ensure that a shape of a loop 501 of magnetic flux is not adversely affected by chamfering, and the like.

FIG. 5A and FIG. 5B further depicts loops 503 of magnetic flux produced by electrical current flowing through the armature coils 321, 322, for example through the channel segments 105, gaps 318, and one or more of respective ferromagnetic cores 307 located in a hollow portion 201 of a channel segment 105. For example, a loop 503 of magnetic flux is generally about parallel to the movement axis 303 of the mover device 111. Put another way, an armature flux path (e.g. a path and/or a loop 503 of magnetic flux produced by the armature coils 321, 322) closes substantially parallel to a direction of motion of the mover device 111. Such a loop 503, and the like, may be referred to as a pole pair and/or a loop 503 may generally represent a pole pair.

FIG. 5A further depicts loops 504 of magnetic flux produced by electrical current flowing through the armature coils 321, 322, for example through gaps 203 between adjacent channel segments 105, and one or more of the ferromagnetic cores 307.

As best seen in FIG. 5A, the loops 503, 504 of the magnetic flux each form a respective closed loop. In particular the loops 503 of the magnetic flux flow through a q-axis (e.g. a quadrature direction) on a side of a channel segment 105, for example at an edge of a gap 203 between the channel segments 105. A q-axis is generally perpendicular to a respective gap 203 between the channel segments 105 A q-axis is similar to a q-axis of "dq" concepts used to describe field-oriented control of electric machines and/or rotary machines.

As depicted, the loops 501 of magnetic flux, due to the field coils 330, interact with respective loops 503 of magnetic flux, due to the armature coils 321, 322 to induce forces 590 on the mover device 111 as the magnetic flux at a d-axis (e.g. of the loops 501) and the magnetic flux at a q-axis (e.g. of the loops 503) "attract" each other (e.g. being a same direction). While forces may also occur in a direction opposite to the forces 590, such forces tend to be very small compared to the forces 590.

Attention is next directed to FIG. 6 which depicts a graph 600 showing a curve 601 of magnetic flux density due to the field coils 330 as a function of distance along the movement axis 303 and/or a mover direction, and a curve 603 of magnetic flux density due to a pole pair, for example as controlled using the armature coils 321, 322. As depicted, the "0" magnetic flux density axis of the curve 603 is offset from the "0" magnetic flux density axis of the curve 601 to better show a relative position of the curve 603 to the curve 601. As shown, a maximum of the curve 603 is located at a "q" axis, similar to FIG. 5A, and a minimum of the curve 603 is located at a similar position at an opposite side of the curve 601. The center of the curve 601 of magnetic flux density due to the field coils 330 is located at a "d" axis, similar to FIG. 5A. In general the d and q axes may be referred to as being parallel, but 90° apart in electrical angle. A direction of a magnetic force Fx, which corresponds to a force 590, is also depicted.

While dimensions of a pole pair and/or a channel segment 105 are not depicted in FIG. 6, in some examples length of a pole pair (e.g. as represented by the curve 603) may be in a range of about 100 mm to about 1000 mm, for example along the movement axis 303 and/or a mover direction of a mover device 111, however longer and/or shorter lengths of a pole pair are within the scope of the present specification; indeed, any suitable length of a pole pair is within the scope of the present specification. A dimension of a channel segment 105 along the track 103 (e.g. a width of a channel segment) may hence be about half a length of a pole pair. However, a ratio of a dimension (e.g. a width) of a channel segment 105 along the track 103 to a length of a pole pair may be any suitable value between 0 and 1, and may be determined experimentally, heuristically, and the like. In other words while, as depicted in FIG. 6, such a ratio may be about "0.5", such a ratio may be any suitable value. Similarly, a corresponding dimension of the gap 203 between channel segments 105 (e.g. a width of a gap 203 between channel segments 105 along the track 103) may be larger or smaller than a dimension (e.g. a width) of a channel segment 105 along the track 103.

Hence, a pitch of a pole pair may be similar to, and/or about the same as, a pitch of the channel segments 105; hence, a pitch and/or geometry, and electrical operation, of the ferromagnetic cores 307 and armature coils 321, 322 of the mover device 111 may be selected to be compatible with a pitch and/or geometry of the channel segments 105, and/or vice versa.

It is generally understood that the armature coils 321, 322 may be controlled such that the magnetic pole pairs are in a fixed position relative to the channel segments 105 and/or the track 103, as the mover device 111 moves therebetween. In other words, as the mover device 111 moves along the track, the armature coils 321, 322 are controlled such that pole pairs of the mover device 111 are located in about a same position relative to the channel segments 105, though the pole pairs may be positioned to reduce back electromotive force (EMF) which may depend on speed of the mover device 111. For example, at "slow" speeds, a peak of a pole pair may be located at the q-axis; however, as the mover device 111 increases in speed, a back EMF may develop and the armature coils 321, 322 may be controlled (e.g. by controlling current and/or voltage thereto) such that a peak of a pole pair moves to the "right" of the q-axis (i.e. further away from the d-axis) to adjust the magnetic flux of the mover device 111 to positions where EMF is reduced and/or where more flux is produced. Speeds at which to move the peak, as well as currents and/or voltages to move the peak, may be determined experimentally and/or heuristically, and/or using electrical models, and the like.

Attention is next directed to FIG. 7 which depicts a schematic block diagram of electrical components which may be used to control the mover device 111 of the HLSM 200, along with flux produced by the armature coils 321, 322 and the field coils 330. FIG. 7 further depicts example positions of channel segments 105 relative to pole pairs of the mover device 111. Electrical connections in FIG. 7 are depicted as solid lines between components, while data connections between are depicted as double ended arrows. FIG. 7 also generally depicts a process for using the HLSM 200 as a propulsion system for the high-speed transport system 100 which may be in a low-pressure environment and/or not in a low-pressure environment, as described previously.

In FIG. 7, the armature coils 321, 322 (e.g. around the ferromagnetic cores 307 (not depicted, but understood to be present) are controlled to produce "M" number of pole pairs (where "M" is an integer), as depicted a Pole Pair 1, a Pole Pair 2, . . . Pole Pair M, resulting in respective magnetic fluxes along the movement axis 303. While the mover device 111 in FIG. 7 is described with respect to three pole pairs (e.g. M=3), the mover device 111 may include as few as one pole pair, two pole pairs, or more than three pole pairs.

The respective magnetic fluxes of each of the pole pairs are also depicted, and respectively labelled as PP1, PP2, . . . PPM. The magnetic fluxes PP1, PP2, . . . PPM are similar to the curve 603, with peaks of the magnetic fluxes PP1, PP2, . . . PPM being located at a respective q-axis, and the like. Positions of channel segments 105 relative to the pole pairs are also depicted, with an excitation flux $\Phi_f$ depicted for each channel segment 105 (e.g. at a d-axis) as produced by the field coils 330. While only field coil 330 is depicted in FIG. 7, both field coils 330-1, 330-2 are understood to be present in the depicted example.

As depicted, the first armature coils 321 and the second armature coils 322 are electrically connected to, and/or in communication with, at least one armature controller 701-1, 701-2, . . . 701-M. The armature controllers 701-1, 701-2, . . . 701-M are interchangeably referred to hereafter, collectively, as the armature controllers 701 and, generically, as an armature controller 701. As depicted, there are a same number "M" of armature controllers 701 as pole pairs, however there may be any suitable number of armature controllers 701, which may be a same or different as a number of pole pairs.

The armature controllers 701 are configured to control the first armature coils 321 and the second armature coils 322 as a multiphase electrical device and/or system, and in particular a 3-phase electrical device and/or system, such that the first armature coils 321 and the second armature coils 322 and the ferromagnetic cores 307 are controlled to form a magnetic pole pair (and/or magnetic pole pairs), for example in conjunction with adjacent channel segments 105. The armature controllers 701 may be integrated with a mover device 111 and/or the armature controllers 701 may be located at the payload 107 and electrically connected to the first armature coils 321 and the second armature coils 322 via electrical connections between the payload 107 and the mover device 111.

While present examples are described with reference to a 3-phase electrical device and/or system, the armature controllers 701 may be configured to control the first armature coils 321 and the second armature coils 322 as an electrical device of any suitable number of phases.

Furthermore, an armature controller 701 may comprise a computing device, one or more processors (and the like), a power supply, and/or any other suitable components for controlling the armature coils 321, 322. Furthermore, while not depicted, the armature controllers 701 may be in communication with another controller and/or computing device which generally controls and/or coordinates the armature controllers 701 including, but not limited to, a controller and/or computing device of a navigation system operated by an operator and/or driver of the payload 107, however such a navigation system may alternatively comprise an autonomous (e.g. driverless) navigation system.

As depicted one armature controller 701 per pole pair is provided. Furthermore, as depicted, each pole pair includes twelve armature coils 321, 322, for example four armature coils 321, 322 controlled according to each of an "A" phase, a "B" phase and a "C" phase (the armature coils 321, 322 labelled according to a respective phase). For example, a group of four armature coils 321, 322 of a given phase may include two first armature coils 321 and two second armature coils 322. However, a pole pair may be formed by any suitable number of armature coils 321, 322 and it is understood that twelve armature coils 321, 322 per pole pair are depicted merely as one example.

In the depicted examples, the "A" phase armature coils 321, 322 are connected in series, the "B" phase armature coils 321, 322 are connected in series, and the "C" phase armature coils 321, 322 are connected in series. While three phases are depicted, as described above, other numbers of phases may be present with the armature controllers 701 adapted accordingly. As depicted the various different phases of armature coils 321, 322 share a common electrical return path and/or a common neutral point (e.g. depicted schematically at a right side of the pole pairs); for example, the phases may be connected in a star configuration. However any suitable configuration for connecting the phases is within the scope of the present specification including, but not limited to, configurations with a common electrical return path and/or a common neutral point, and configurations without a common electrical return path and/or a common neutral point such as a delta configuration, and the like.

An armature controller 701 may include power sources, such as respective batteries and the like which may be located at the mover device 111 and/or at the payload 107. Put another way, the various groups of armature coils 321, 322 (e.g. grouped by pole pair) may include multiple power sources. An armature controller 701 may comprise a relatively low power and/or low voltage drive (e.g. with maximum voltages of less than about 1 kV), rather than a conventional high power drive (e.g. which may operate at voltages greater than 1 kV) supplying power to an entire propulsion system. Each armature controller 701 and/or low power drive may be connected to one or more of the pole pairs.

As depicted, the at least one field coil 330 is electrically connected to, and/or in communication with, at least one field coil controller 702 configured to form a loop of magnetic flux about perpendicular to the cold plate 301, as described above. In particular, the field coils 330 may be connected in series, though the field coils 330 may alternatively be connected in parallel. The field coil controller 702 may be integrated with a mover device 111 and/or the field coil controller 702 may be located at the payload 107 and electrically connected to the at least one field coil 330 via electrical connections between the payload 107 and the mover device 111.

Furthermore, the field coil controller 702 may comprise a computing device, one or more processors (and the like), a power supply (e.g. batteries, and the like), and/or any other suitable components for controlling the at least one field coil 330, which may be located at the mover device 111 and/or at the payload 107. Furthermore, while not depicted, the armature controllers 701 (and/or the field coil controller 702) may be in communication with another controller and/or computing device which generally controls and/or coordinates the armature controllers 701 (and/or the field coil controller 702) including, but not limited to, the controller and/or computing device of the navigation system as described above.

As depicted, the armature controllers 701 are in communication with a position sensor 703 configured to determine a position of the mover device 111 relative to the channel segments 105 and to output, to the armature controllers 701, a position 704 which may comprise a "rotor" position of the mover device 111 relative to the channel segment 105. Such a "rotor" position may comprise a position to which peaks of the magnetic fluxes PP1, PP2, . . . PPM are to be controlled, for example relative to the mover device 111, such as a q-axis, and/or any other suitable relative (or absolute) position. Put another way, at least one armature controller 701 may be in communication with the position sensor 703, the position sensor 703 configured to determine the position 704 used to control a respective position of at least one magnetic pole pair.

The position sensor 703 may be integrated with a mover device 111 and/or the position sensor 703 may be located at the payload 107.

The position sensor 703 may comprise one or more of a laser-based position determining device, a radar-based position determining device, a video-based position determining device, field-based position determining device (e.g. which determined position from perturbations in the magnetic fields and/or fluxes, for example as represented by the loops 501, 503 described above), and the like.

The armature controllers 701 are configured to receive the position 704 and control the magnetic fluxes PP1, PP2, . . . PPM of the pole pairs accordingly by controlling voltage, current and/or phase of the armature coils 321, 322. In some examples the magnetic fluxes PP1, PP2, . . . PPM of the pole pairs are controlled such that a peak is at a respective q-axis though the position may change with speed of the mover device 111. As the mover device 111 moves relative to the channel segments 105, the peaks of the magnetic fluxes PP1, PP2, . . . PPM may be maintained at q-axes (and/or a changed according to speed). As a front pole air of the mover device 111 encounters a next channel segment 105, for example as determined from the position 704, and the field coils 330 produce a magnetic flux in the next channel segment 105, an armature controller 701 controls the front pole pair such that a peak of a respective magnetic flux PP is located at a q-axis, and the like, of the next channel segment 105. Put another way, the combination of the magnetic fluxes PP1, PP2, . . . PPM, as depicted in FIG. 7, may "appear" to be a standing wave with respect to the channel segments 105, and hence may generally "move" relative the mover device 111.

Furthermore, while the mover device 111 is described with respect to a "front" and/or "rear" and the like, it is understood that the mover device 111 may be controlled to move in in either direction along the movement axis 303 such that pole pairs at opposite ends of the mover device 111 may be front pole pair and/or a first pole pair, and/or a rear pole pair and/or a last pole pair, depending on a direction of force on the mover device 111 (e.g. a direction of the force 590). For example, the armature controllers 701 may be configured to invert the magnetic fluxes PP1, PP2, . . . PPM with respect to as depicted in FIG. 7 to reverse a direction of force of the mover device 111 which may result in one or more of braking of the mover device 111 and/or a reversal of a direction of movement of the mover device 111.

While examples heretofore have been described with respect to the mover device 111 having one cold plate 301, the mover device 111 may be adapted to include more than one cold plate. For example, attention is next directed to FIG. 8 which depicts a portion of an alternative HLSM 800 that includes an alternative mover device 811 located in a channel segment 105, and separated from the channel segment 105 by gaps 318. The mover device 811 includes a plurality of cold plates 301-1, 301-2, for example similar to the cold plate 301, ferromagnetic cores (e.g. ferromagnetic cores 807-1, 807-2), and a plurality, and/or layers, of armature coils 321, 322, 823, (e.g. including the first armature coils 321 and the second armature coils 322 as described above, and additional armature coils 823). While only two ferromagnetic cores 807-1, 807-2 are numbered for simplicity, it is understood that the mover device 811 includes any suitable number of ferromagnetic cores 807-1, 807-2 which extend through respective slots in the cold plates 301, similar to as described above with respect to the ferromagnetic cores 307 and the slots 305. In other words, while slots of the cold plates 301 of the mover device 811 are not depicted, it is understood that each of the cold plates 301 of the mover device 811 includes slots which are aligned such that a respective ferromagnetic core 807-1, 807-2 extends through all of the cold plates 301. For example, as depicted the two cold plates 301-1, 301-2 may trisect the ferromagnetic cores 807-1, 807-2 (e.g. divide the 807-1, 807-2 into three about equal portions).

The plurality of cold plates 301 and the plurality of armature coils 321, 322, 823 are alternating such that a given cold plate 301 is between a pair of layers of armature coils 321, 322, 823. For example, the cold plate 301-1 is between layers of the armature coils 321, 322, and the cold plate 301-2 is between layers of the armature coils 322, 823. The armature coils 321, 322, 823 are also labelled with respect to their phase (e.g. "A", "B", "C") similar to as described above. It is understood from FIG. 8 that while the armature coils 321, 322 have mirror symmetry with respect to the cold plate 301-1, the armature coils 823 are not symmetric with the adjacent armature coils 321; however, armature coils 823 of a given phase are aligned with armature coils 321, 322 of the given phase along the ferromagnetic cores 807 in a direction of the cold plates 301.

Hence, in general, the mover device 811 is similar to the mover device 111 but includes an additional cold plate 301 and an additional layer of armature coils 823 (e.g. which may be referred to as third armature coils 823 and/or a third layer of armature coils 823 and/or a third set of armature coils 823). The armature coils 823 may be controlled in a similar manner to the armature coils 321, 322 as described with respect to FIG. 5A, FIG. 5B, FIG. 6 and FIG. 7.

While not depicted in FIG. 8, it is understood that the mover device 811 further includes any suitable number of field coils 330.

Furthermore, additional cold plates and layers (and/or sets) of armature coils may be added to the mover device 811 (and/or the mover device 111), for example as a pair of a cold plate and a corresponding layer (and/or set) of armature coils.

Hence, also provided herein is a mover device comprising: one or more cold plates; a plurality of layers of armature coils, the one or more cold plates and the plurality of layers of armature coils alternating and/or arranged such that a given cold plate is between a pair of layers of armature coils; and a plurality of ferromagnetic cores which extend through respective slots in the one or more cold plates, the plurality of layers of armature coils located around the plurality of ferromagnetic cores with, for example, armature coils of respective phases aligned along the plurality of ferromagnetic cores from layer to layer. However, other configurations and/or arrangements of cold plates and armature coils are within the scope of the present specification; for example, a mover device may include two layers of armature coils with a cold plate therebetween, and a third layer (or more) of armature coils adjacent one (or more) of the two layers of armature coils without a second cold plate, with the armature coils of all three layers of armature coils around common ferromagnetic cores which extend through slots of the cold plate. Alternatively, a mover device may include a first structure comprising two layers of armature coils with a cold plate therebetween, and a second structure comprising two further layers of armature coils with a further cold plate therebetween, slots of the cold plates being aligned, with common ferromagnetic cores extending therethrough; the armature coils of the first structure and the second structure are around the ferromagnetic cores. Indeed, any mover device that includes two layers of armature coils with a cold plate therebetween, the armature coils of the two layers around common ferromagnetic cores which extend through slots of the cold plate, is within the scope of the present specification, and which may include additional layers of armature coils around the ferromagnetic cores and/or additional cold plates with respective slots through which the ferromagnetic cores extend.

Attention is next directed to FIG. 9 which depict details of the cold plate 301. In particular, FIG. 9 depicts a perspective view of the cold plate 301 in the absence of armature coils, field coils, and ferromagnetic cores. From FIG. 9, it is understood that the cold plate 301 may be rectangular and that the slots 305 are rectangular, and/or complementary to geometry and/or shape and/or cross-sectional shape of the ferromagnetic cores 307. It is further understood that the slots 305 are arranged aligned with each other along the movement axis 303.

While not depicted, the cold plate 301 may include at least one cooling channel on a face and/or a side thereof which may be formed in any suitable manner.

Furthermore, the cold plate 301 may be made of a metal with any suitable thermal and electrical properties such as aluminum, copper, titanium, magnesium, stainless steel, and the like. Hence, the armature coils 321, 322 and field coils 330 may be substantially in contact with the cold plate 301, and/or at least partially in contact with the cold plate 301, such that heat is transferred out of the armature coils 321, 322 and field coils 330 and into the cold plate 301 and which may be at least partially removed via cooling channels of the cold plate 301.

The cold plate 301 may further comprises gaps and/or slits 920 that extend from the slots 305 to one or more edges of the cold plate 301. The slits 920 are generally substantially narrower than the slots 305 and are provided to form "fingers" and/or "teeth" which extend from the slots 305 to reduce eddy currents in the cold plate 301 and/or around the slots 305, which may occur when the cold plate 301 is exposed to changing magnetic flux during operation of the mover device 111. Put another way, the cold plate 301 may include a "toothed" geometry, with gaps and/or slits 920 across the cold plate 301.

Furthermore, while a particular geometry of the slits 920 are depicted, the slits 920 may have any suitable geometry that may be used to reduce eddy currents.

Attention is next directed to FIG. 10A, FIG. 10B and FIG. 10C which depict details of the ferromagnetic cores 307. In particular, FIG. 10A depicts a perspective view of the cold plate 301 with the ferromagnetic cores 307 attached thereto, for example as inserted through respective slots 305, and attached to the cold plate 301 using mounting brackets 1007 which attach to both a ferromagnetic core 307 and to (for example) apertures (not depicted) at ends of the slots 305. In the depicted example, there are twenty-five ferromagnetic cores 307 inserted through a corresponding number of the slots 305 in the cold plate 301. The mounting brackets 1007 may be of any suitable material, such as stainless steel, PTFE brackets, and the like, and/or any suitable non-ferromagnetic material.

FIG. 10B depicts a perspective view of a ferromagnetic core 307 with two mounting brackets 1007 mounted there to, for example on opposing short sides 1008 of the ferromagnetic core 307 which join longer opposing faces 1009 (only one of which is visible in FIG. 10B). With brief reference back to FIG. 10A, the faces 1009 are generally located in a direction of the movement axis 303 when mounted to the cold plate 301, and form the gaps 308 between the ferromagnetic cores 307; faces 1009 of the ferromagnetic cores 307 are hence generally about parallel to each other when the ferromagnetic cores 307 are mounted to the cold plate 301. The armature coils 321, 322 are generally located around the short sides 1008 and the faces 1009.

Returning to FIG. 10B, the ferromagnetic cores 307 further include opposing outer surfaces 1010 which may form a "top" and "bottom" of a ferromagnetic core 307 and which are joined to the opposing short sides 1008 and opposing faces 1009. The outer surfaces 1010 form respective gaps 318 with a channel segment 105.

With further reference to FIG. 10B, the ferromagnetic core 307 may further include optional grooves 1011 that extend along the opposing faces 1009, for example between the opposing short sides 1008, to provide a mechanism to retain, for example, a slot wedge of a retention device 399 as described in more detail below with respect to FIG. 15.

A ferromagnetic core 307 may be laminated to reduce eddy currents. For example, FIG. 10C depicts an example of a lamination portion 1017 of a ferromagnetic core 307 which may comprise silicon steel, cobalt steel and the like and which may be coated with an electrically insulating coating, and the like. The lamination portion 1017 may be formed using stamping and/or any other suitable process. A plurality of the lamination portions 1017 may be joined and/or bonded together in a stack to form a ferromagnetic core 307, for example using bolts and/or pins (not depicted), extending through apertures 1018 in the lamination portions 1017. A position of grooves 1021 in the lamination portion 1017 is also indicated which, when a plurality of the lamination portions 1017 are joined, form the grooves 1011; it is hence understood that a ferromagnetic core 307 may be laminated in a direction perpendicular to the movement axis 303.

Attention is next directed to FIG. 11A, FIG. 11B and 11C which depict details of the stepped armature coils 321, 322. In particular, FIG. 11A depicts a perspective view of the cold plate 301 with the ferromagnetic cores 307 and armature coils 321, 322 attached thereto. While in FIG. 11A only the armature coils 321 are visible, it is understood that the armature coils 322 are also attached to the cold plate 301, for example at a side opposite that depicted in FIG. 11A. For example, FIG. 11A may depict the first side 311 of the cold plate 301, and the second side 312 of the cold plate 301 is "under" the first side 311 in the orientation of FIG. 11A.

Indeed, considered together, FIG. 9, FIG. 10A and FIG. 11A show a method of assembling at least a portion of the mover device 111, for example by inserting the ferromagnetic cores 307 through the slots 305 and attaching the ferromagnetic cores 307 to the cold plate 301 via the mounting brackets 1007, as from FIG. 9 to FIG. 10A, and placing the stepped armature coils 321, 322 around the ferromagnetic cores 307, as from FIG. 10A to FIG. 11A.

FIG. 11B depicts a "top" perspective view of a stepped armature coil 321, and FIG. 11C depicts a "bottom" perspective view of the stepped armature coil 321 of FIG. 11B; while a stepped armature coil 322 is not depicted, a stepped armature coil 322 is understood to be similar to the stepped armature coil 321 of FIG. 11B and FIG. 11C. The terms "top" and "bottom" are used in conjunction with the orientation of the mover device 111 depicted in FIG. 11A and it is understood that stepped armature coils 321 may be provided in any suitable orientation. Furthermore, the orientation of the stepped armature coil 321 in FIG. 11C has been selected to emphasize certain features such as angled portions described below.

As previously described, and with reference to FIG. 11B and 11C, the stepped armature coil 321 comprises three steps 325-1, 325-2, 325-3 which are arranged along a first axis 1111 and a second axis 1112 about perpendicular to the first axis 1111. When the stepped armature coil 321 is attached to the cold plate 301, and for example surrounds two ferromagnetic cores 307, the first axis 1111 is about perpendicular to the movement axis 303 of the cold plate 301, and the second axis 1112 is about parallel to the movement axis 303 of the cold plate 301.

It is apparent from FIG. 11B and FIG. 11C that the first step 325-1 and the third step 325-3 are each of a similar length, and run parallel to the first axis 1111. However, the second step 325-2 comprises respective portions 325-2-1, 325-2-2 that are joined to each of the first step 325-1 and the third step 325-3 on opposite sides of the stepped armature coil 321, via respective angled portions 1150 (as best seen in FIG. 11C), and along the second axis 1112.

Furthermore, the steps 325-1, 325-2, 325-3 are offset from one another in along a third axis 1113 (as best seen in FIG. 11C) that is perpendicular to the first axis 1111 and the second axis 1112, such that adjacent stepped armature coils 321 may be stacked laterally, with the third step 325-3 adjacent a respective second step of an adjacent stepped armature coil, and the second step 325-2 adjacent a respective first step of the adjacent stepped armature coil. Such an arrangement allows for compact placement of the armature coils 321, 322 in the mover device 111. Furthermore the third axis 1113 is about normal to the cold plate 301 when the stepped armature coil 321 is mounted thereon.

While the stepped armature coil 321 is depicted with three steps, a stepped armature coil may include any suitable number of steps. In particular a number of steps of a stepped armature coil may correspond to a number "N" of the ferromagnetic cores 307 around which a stepped armature may be placed, plus one (e.g. "N+1", where "N" is an integer). For example, the stepped armature coil 321 is configured to be around two ferromagnetic cores 307 and hence the stepped armature coil 321 includes three steps 325.

However, a stepped armature coil may be configured to be around one ferromagnetic core 307 and may include two steps, for example a first step across a first face 1009, of the one ferromagnetic core 307, at the cold plate 301, and a second step across a second face 1009, of the one ferromagnetic core 307 (e.g. opposing the first face 1009), at an outer surface 1010; angled portions may join the first step and the second step along the short sides 1008.

Similarly, a stepped armature coil may be configured to be around three ferromagnetic cores 307 and may include four steps, for example: a first step across a face 1009, of a first ferromagnetic core 307, at the cold plate 301; second and third steps (e.g. similar to the second step 325-1, the second and third steps include portions on opposite sides of the four step armature coil) at respective gaps 308 between the first and second ferromagnetic cores 307, and between the second and third ferromagnetic cores 307; and a fourth step at a respective face 1009 of the third ferromagnetic core 307 (e.g. opposing the face 1009 of the first ferromagnetic core) at an outer surface 1010 the third ferromagnetic core 307. First angled portions may join the first step to the second step along short sides 1008 of the first ferromagnetic core 307; second angled portions may join the second step to the third step along short sides 1008 of the second ferromagnetic core 307; and third angled portions may join the third step to the fourth step along short sides 1008 of the second ferromagnetic core 307.

Indeed, a two-step armature coil may be for "concentrated" windings (e.g. with armature coils around one ferromagnetic core), a three step armature coil may be for "short pitch" windings (e.g. with armature coils around two ferromagnetic cores), and four step armature coil may be for "full pitch" windings (e.g. with armature coils around three ferromagnetic core).

While stepped armature coils are described above with respect to a number of steps of corresponding to "N+1" of the ferromagnetic cores 307, a stepped armature coil may have other numbers of steps including, but not limited to N+2, N+3 . . . etc., of the ferromagnetic cores 307.

As depicted, the stepped armature coil 321 comprises electrical leads 1180-1, 1180-2 which connect to electrical loops therein, such that an armature controller 701 may be connected thereto, for example, the electrical leads 1180-1, 1180-2 may be connected to opposite electrical ends of the electrical loops. The electrical leads 1180-1, 1180-2 may comprise any suitable electrical leads and/or busbars and/or conductive members which may be used to electrically connect the stepped armature coil 321 as described herein. As depicted, the electrical lead 1180-1 extends to a side of the stepped armature coil 321 in a direction of the first axis 1111, at about a level of the first step 325-1, and the electrical lead 1180-2 extends to the same side of the stepped armature coil 321 at about a level of the third step 325-3. Hence, when the stepped armature coils 321 are around the ferromagnetic cores 307, the electrical leads 1180-1, 1180-2 may be electrically connected and/or joined to other stepped armature coils 321 of a same phase, for example using any suitable wiring scheme, electrical connectors and the like. Such electrical joining may occur along a length of the cold plate 301, for example along the movement axis 303.

While not depicted, a stepped armature coil 321 may further comprise a busbar, and the like, which may extend from an electrical lead 1180 along the movement axis 303. A busbar may be electrically connected (e.g. using any suitable fastener such as bolts and the like) to an electrical lead 1180 of another stepped armature coil 321 for example to form at least a portion of electrical connections between the armature coils 321, 322 as depicted in FIG. 7.

A stepped armature coil 321 may be manufactured in any suitable manner using, for example, suitably shaped blocks and/or forms and/or tools (to form a shape thereof), annealing, resins and the like. An electrical lead 1180 and/or a busbar, and the like, may be brazed and/or soldered, and the like, to a wire, and the like, of the stepped armature coil 321 that form the electrical loops. The stepped armature coil 321 may be wrapped in an insulating material, such as polyamide enamel, polyamide tape, mica tape, and the like, as described above, though conducting material of the stepped armature coil 321 may have an insulating coating, such as aluminum oxide of anodized aluminum foil.

While examples described heretofore have been described with respect to stepped armature coils 321, 322, armature coils of any suitable configuration are within the scope of the present specification. Indeed, with reference to FIG. 11A, while first two and last two ferromagnetic cores 307 along the movement axis 303 include one respective stepped armature coil 321 therearound, such stepped armature coils 321 may be replaced by armature coils of other geometries including, but not limited to, flat armature coils. Such flat armature coils may further be used in place of stepped armature coils in mover devices as described herein.

For example, attention is next directed to FIG. 12A and FIG. 12B which depict an HLSM 1200 comprising the channel segments 105 and a mover device 1211 which comprises armature coils 1221, 1222 which are not stepped, the cold plate 301, the ferromagnetic cores 307, and at least one field coil 330, which may be adapted to the geometry of the mover device 1211. FIG. 12A depicts a cross-section of a portion of the mover device 1211 to show an arrangement of the armature coils 1221 relative to the ferromagnetic cores 307, and FIG. 12B depicts a perspective view of the armature coils 1221 relative to the ferromagnetic cores 307. While a perspective view of the armature coils 1222 is not depicted, it is understood that the armature coils 1221, 1222 are arranged as mirror images of each other relative to the cold plate 301 therebetween, for example as best seen in FIG. 12B.

In contrast to the stepped armature coils 321, 322, the armature coils 1221, 1222 are flat, and a layer of the armature coils 1221 (and/or the armature coils 1222) may be formed from sublayers of the armature coils 1221, for example relative to the cold plate 301 (e.g. and about parallel thereto) and/or the ferromagnetic cores 307. For example, FIG. 12A and FIG. 12B respectively depict a cross-sectional view and a perspective view of three sublayers of the armature coils 1221, each sublayer operated at a corresponding phase as described above. The cross-sectional view of FIG. 12A is through a length of the perspective view of FIG. 12B.

For example, armature coils 1221 in a first sublayer are labelled as "A" to indicate they may be operated in an "A" phase, armature coils 1221 in a second sublayer are labelled as "C" to indicate they may be operated in an "C" phase, and armature coils 1221 in a third sublayer are labelled as "B" to indicate they may be operated in an "B" phase. The armature coils 1222 are similarly labelled according to phase. Furthermore different armature coils 1221, 1222 of a same phase are labelled as A1, A2, A3 etc. in each of FIG. 12A and FIG. 12B for comparison. For example, the depicted armature coils 1221 in FIG. 12A are labelled A1, A2, A3, B1, B2, C1, C2, and the depicted armature coils 1222 in FIG. 12A are labelled A4, A5, A6, B3, B4, C3, C4 (e.g. as three "A" phase armature coils 1221, 1222, and two of each of "B" phase and "C" phase armature coils 1221, 1222 are visible in FIG. 12A). Furthermore while not all the armature coils 1221, 1222 are labelled it is understood the armature coils 1221 in a same respective sublayer are operated at a same phase, and the armature coils 1222 in a same respective sublayer are operated at a same phase. Furthermore, as depicted, the armature coils 1222 may be arranged in a mirror image of the armature coils 1221, with respect to the cold plate 301.

Put another way, the armature coils 1221, 1222 which, when viewed from a cross-section, may be arranged in sublayers, such that all armature coils 1221, 1222 of the same phase may be a same distance from a ferromagnetic core surface (which, in these examples, may refer to a side of a ferromagnetic core 307 that is furthest from the cold plate 301), and armature coils 1221, 1222 of different phases may be different distances from a ferromagnetic core outer surface (e.g. relative to the cold plate 301). A portion of a first armature coil 1221, 1222 in a first sublayer may overlap a portion of a second armature coil 1221, 1222 in a second sublayer, which may provide a short pole pitch as a result.

Each armature coil 1221 is around two adjacent ferromagnetic cores 307, and armature coils 1221 in adjacent sublayers are offset laterally by one ferromagnetic core 307, which results in two armature coils 1221 of different phases being around a ferromagnetic core 307. Such an arrangement may be referred to as a three-layer integer winding with a ⅔ short pitch; while the armature coils 1221 may be easier to manufacture than the stepped armature coils 321, 322, the armature coils 1221 may be more challenging to operate electrically in a mover device, for example to generate pole pairs, as the various electrical phases are at the different levels which may lead to complex and/or asymmetric driving voltages relative to driving voltages for the stepped armature coils 321, 322.

In yet further examples, a cold plate may be incorporated into a layer of the armature coils 1221, and/or a layer of the armature coils 1222. For example such a cold plate may be between adjacent sublayers of the armature coils 1221 and/or such a cold plate may between adjacent sublayers of the armature coils 1222. Such a cold plate may replace the cold plate 301 and/or be in addition to the cold plate 301; regardless such a cold plate has a similar geometry to the cold plate 301 and hence includes slots 305 through which the ferromagnetic cores 307 extend.

Yet further configurations of armature coils are within the scope of the present specification. For example, attention is next directed to FIG. 13A and FIG. 13B which respectively depict cross-sectional and top (or bottom) views of a portion of a mover device 1311 that includes a cold plate 301 (e.g. adapted for the geometry and/or operation of the mover device 1311), at least one field coil 330, ferromagnetic cores 1307 and armature coils 1321 that includes concentrated windings (CW) and/or fractional slot concentrated windings (FSCW). The ferromagnetic cores 1307 are similar to the ferromagnetic cores 307 but adapted for the CW armature coils 1321, such that the ferromagnetic cores 1307 are wider at opposing outside surfaces and narrower where the CW armature coils 1321 are located. The cross-sectional view of FIG. 13A is through a length of the top view of FIG. 13B.

As best seen in FIG. 13A, a CW armature coil 1321 may be located around one ferromagnetic core 1307, and adjacent CW armature coils 1321 are driven according to different electrical phases, for example as indicated by "A", "B" or "C" at an CW armature coil 1311, similar to the notation used previously.

Put another way, in some examples of the present specification armature windings and/or armature coils, may be configured as concentrated windings and/or fractional slot concentrated windings, with concentrated windings distributed throughout ferromagnetic cores located along a length of a rotor/mover device.

Such CW armature coils 1321 may provide high power density and/or high efficiency and/or short end windings and/or good flux weakening capability and/or easy manufacturability and/or tight packaging and/or easier cooling of end windings (e.g. as compared to the stepped armature coils 321, 322). However, such CW armature coils 1321 may have higher track losses and/or higher harmonic content in back EMF and airgap flux density as compared to the stepped armature coils 321, 322. Furthermore, driving voltages thereof may be more complex than that used with the stepped armature coils 321, 322.

In yet further examples a mover device 111 may be adapted to include diamond-shaped armature coils. For example, attention is next directed to FIG. 14A and FIG. 14B which depict cross-sectional and perspective views of a portion of mover device 1411, at least one field coil 330 (e.g. adapted for the geometry of the mover device 1411), ferromagnetic cores 1407 and armature coils 1421 that are diamond shaped. The ferromagnetic cores 1407 may be similar to the ferromagnetic cores 307 but adapted for the geometry of the mover device 1411. The cross-sectional view of FIG. 14A is through a length of the perspective view of FIG. 14B.

As best seen in FIG. 14A, which depicts a cross-section of the diamond armature coils 1421 and the ferromagnetic cores 1407, a diamond armature coil 1421 may be located around three ferromagnetic cores 1407, and adjacent diamond armature coils 1421 are driven according to different electrical phases, for example as indicated by "A", "B" or "C" at a diamond armature coil 1411, similar to the notation used previously. Different diamond armature coils 1421 of a same phase are indicated using a notation "A1", "A2", etc., similar to FIG. 12A. While, as depicted, a diamond armature coil 1421 may be located around three ferromagnetic cores 1407 (e.g. "full pitch"), a diamond armature coil may be adapted to be located around two ferromagnetic cores 1407 (e.g. "short pitch").

As best seen in FIG. 14A, the diamond armature coils 1421 have a geometry which may enable them to be partially stacked and offset from each other at outer surfaces 1410 of the ferromagnetic cores 1407. For example, a "C" phase diamond armature coil 1421 "C2" may be around three ferromagnetic cores 1407 at one outer surface 1410 with a next diamond armature coil 1421 "B2" (e.g. to the right of "C2" in FIG. 14A) stacked onto the diamond armature coil 1421 "C2" at the same outer surface 1410, and offset by one ferromagnetic core 1407. The diamond armature coils 1421 also have a step structure such that opposite sides (e.g. steps) of an armature coil 1421 located in respective gaps between ferromagnetic cores 1407 are joined by angled bent portions 1450 that extend substantially out from sides of the armature coils 1421, as best seen in FIG. 14B. Furthermore, a given gap between adjacent ferromagnetic cores 1407 may include stacked steps of two diamond armature coils 1421 which may be operated at a same phase (e.g. portions of diamond armature coils 1421 labelled "C2" and "C3" are in a same gap). A similar set of diamond armature coils 1421 is at an opposing outer surface 1410, the diamond armature coils 1421 aligned along the ferromagnetic cores 1407 according to phase. A field coil 330 may be located between the angled bent portions 1450 of the diamond armature coils 1421 at the opposing surfaces 1410. While such diamond armature coils 1421 may provide favorable electrical properties they are not as compact as armature coils described heretofore (e.g. the stepped armature coils 321, 322) and are harder to integrate with a cold plate (e.g. which is not depicted in FIG. 14A or FIG. 14B).

Attention is next directed to FIG. 15 which depicts a side perspective view of a portion of the mover device 111 that includes the cold plate 301, the ferromagnetic cores 307, the armature coils 321, and the retention device 399. In FIG. 15 the field coils 330 are removed to show the components within the field coils. FIG. 15 further depicts a cross-section 1503 of a region 1501 that includes ferromagnetic cores 307, armature coils 321, and a retention device 399.

In particular, the cross-section 1503 shows that the retention device 399 may comprise a slot wedge 399-1, for example retained in a gap 308 between adjacent ferromagnetic cores 307 via respective grooves 1011 of the adjacent ferromagnetic cores 307. In some examples, a slot wedge 399-1 may comprise a ferromagnetic material including, but not limited to, magnetically impregnated fiberglass material, which may assist in reducing force ripple in the HLSM 200. The slot wedge 399-1 may apply pressure against the armature coils 321 in the gap 308, for example further using a ripple spring 159-2, which may be compressed by the slot wedge 399-1 against the armature coils 321, which are in turn compressed towards the cold plate 301, which may remove and/or draw heat from the armature coils 321 (i.e. to cool the armature coils 321), as described above.

Regions between the armature coils 321 may be at least partially filled with at least one spacer block 1599. A spacer block 1599 may comprise a thermally conductive plastic, and the like, and may be manufactured using may be injecting molding and/or any other suitable technique. Such a spacer block 1599 may improve thermal conduction between an end of an armature coil 321 in the gap 308 which is not adjacent the cold plate 301, and a respective end of a respective armature coil 321 in the gap 308 which adjacent the cold plate 301. Put another way, the mover device 111 may further comprise one or more spacer blocks 1599 between the ferromagnetic cores 307 and between respective armature coils 321 located around the ferromagnetic cores 307; the one or more spacer blocks 1599 may be configured to conduct heat from one or more of the ferromagnetic cores 307 and the respective armature coils 321 to the cold plate 301.

While functionality of the retention devices 399 and the spacer block 1599 is described with respect to the armature coils 321, such retention devices 399 and spacer blocks 1599 may be similarly integrated with armature coils 322 and/or with any other suitable armature coils and/or mover devices described herein.

Attention is next directed to FIG. 16 which depicts the mover device 111 in an assembled state. It is understood that, considered together, FIG. 9, FIG. 10A, FIG. 11A, FIG. 3 and FIG. 16 show a method of assembling the mover device 111 (e.g. FIG. 3 is similar to FIG. 11A but shows the field coils 330 attached to the mover device 111 prior to a final assembly of the mover device 111 as depicted in FIG. 16).

In particular, the mover device 111 may further comprise an electrically insulating material 1601 encapsulating at least a portion of one or more of the cold plate 301, the ferromagnetic cores 307, the first armature coils 321, the second armature coils 322 and the at least one field coil 330.

For example, in FIG. 16, at least a portion of the cold plate 301, the ferromagnetic cores 307, the first armature coils 321, the second armature coils 322 and the at least one field coil 330 has been encapsulated using the electrically insulating material 1601. The electrically insulating material 1601 may comprise an electrically insulating material, and/or combination of materials, which may be vacuum-compatible; the electrically insulating material 1601 may include, but is not limited to, an epoxy, a resin, and the like, and which may include a soft materials and/or hard materials. The mover device 111 may be encapsulated using any suitable technique including, but not limited to, global vacuum pressure impregnation (VPI), vacuum casting, auto pressure gelation (APG), and the like.

The mover device 111 may be at least partially coated and/or painted with a conductive coating and/or shielding and/or material and/or a semi-conductive coating and/or shielding and/or material 1602 to assist in containing electric fields of the mover device 111, for example to reduce electrical discharge and/or generation of plasma at the mover device 111.

As depicted, the mover device 111 may include a reinforcement member 1603 which runs along an edge of the cold plate 301. While as depicted the reinforcement member 1603 is C-shaped (e.g. in cross-section), the reinforcement member 1603 may be of any suitable shape, including, but not limited to, an I-shape, and an L-shape, and the like. The reinforcement member 1603 may comprise rigid material, including, but not limited to, stainless steel, and the like.

Furthermore, while as depicted the reinforcement member 1603 is external to the electrically insulating material 1601, the reinforcement member 1603 may be internal to the electrically insulating material 1601 and/or internal to mover device 111; indeed, the reinforcement member 1603 may be in any suitable position. The reinforcement member 1603 may be encapsulated by the electrically insulating material 1601, partially encapsulated by the electrically insulating material 1601, and/or external to the electrically insulating material 1601. The reinforcement member 1603 may, in some examples, be electrically insulated from components of the mover device 111 which conduct magnetic flux and/or electric current.

Furthermore, while as depicted the reinforcement member 1603 is along an edge of the cold plate 301 to which slits 920 from the slots 305 extend, the reinforcement member 1603 may be along any suitable edge of the cold plate 301. Put another way, the edge of the cold plate 301, along which the reinforcement member 1603 runs, may include the slits 920 configured to reduce eddy currents, as described above.

For example, comparing FIG. 16 with FIG. 9, it is apparent that the reinforcement member 1603 extends along an edge of the cold plate 301 that include the slits 920. For example, while such slits 920 may be useful in reducing eddy currents, such slits 920 may also reduce structural support of the mover device 111. Hence the reinforcement member 1603 may comprise any suitable rigid material and/or stiff material, such as stainless steel, aluminum, a composite, and the like which may be used to provide additional structural support and/or reinforcement and/or stiffness for the mover device 111. As such the reinforcement member 1603 may alternatively be referred to as a stiffening member, and the like. The material of the reinforcement member 1603 is further non-magnetic. The material of the reinforcement member 1603 may further be conductive or non-conductive. The reinforcement member 1603 may be electrically insulated from the cold plate 301 and/or the "teeth" of the cold plate 301 formed by the slits 920 at edge of the cold plate 301 along which the reinforcement member 1603 may extend.

As depicted, the assembled mover device 111 includes one or more attachment units 1605, including, but not limited to brackets, walls and the like, which may be to attach the assembled mover device 111 to the payload 107 (e.g. using bolts, pins and the like). As depicted, the attachment units 1605 include walls which may extend from brackets (not depicted), which may provide additional structural integrity for the mover device 111. The attachment units 1605 connect the mover to the payload, and may be attached to the reinforcement member 1603 for additional stiffness and/or reinforcement. While not depicted, attachment brackets of the attachment units 1605 may be located at an edge of the mover device 111 opposite the reinforcement member 1603; hence, the slits 920 may be at an edge opposite the payload 107 and may be located in the channel segments 105 when the mover device 111 is in operation with the HLSM 200.

As described herein the track 103 is generally configured for magnetic saliency, by way of the spaced channels segments 105. However, such saliency may be provided by other configurations of the track 103. For example, attention is next directed to FIG. 17 which depicts an example of an elongated C-shaped channel 1705 which includes airgaps 1706, 1707 of alternating height which provide magnetic saliency to the C-shaped channel 1705. The mover device 111 may hence interact with the C-shaped channel 1705 similar to as described with respect to the channel segments 105.

Yet further alternatives are within the scope of the present specification. For example, the system 100 may be adapted to include a wireless charging system and/or wireless charging devices which may be used to charge batteries of the mover device 111 using, for example, induction. Such wireless charging devices may be incorporated into the channel segments 105 and/or mounted along the track 103 in any suitable position. Such wireless charging devices may include windings and/or coils at the track 103 to provide the charging. In these examples, the mover device 111 and/or the payload 107 may be adapted to include a wireless charging system that interacts with the wireless charging devices to charge batteries used to power the field coils 330 and the armature coils 321, 322. Put another way, propulsion of the rotor/mover device 111 along a stator/track 103, in which such wireless charging is incorporated, may be provided. Indeed, the use of electromagnetic fields to propel the mover device 111 may allow for an easy transition into inductor-based charging, allowing a vehicle, such as the payload 107 that includes batteries to charge as the rotor moves along the stator.

Provided herein are various homopolar linear synchronous machines that may be used with a transportation system. Mover devices as described herein generally do not include yokes, nor iron backplanes and the like, which may reduce weight as compared to mover devices that include yokes and/or iron backplanes. Furthermore, removal of material from cold plates for insertion of ferromagnetic cores therethrough may further reduce weight of a mover device. Indeed, reduction of weight of mover devices in homopolar linear synchronous machines may be important when levitating payloads that that are propelled by such homopolar linear synchronous machines, to reduce use of power in such processes. Furthermore, use of short pitch armature coils and/or stepped armature coils, and insertion of ferromagnetic cores through a cold plate may provide for a compact mover device of a homopolar linear synchronous machine.

In this specification, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

It is understood that for the purpose of this specification, language of "at least one of X, Y, and Z" and "one or more of X, Y and Z" can be construed as X only, Y only, Z only, or any combination of two or more items X, Y, and Z (e.g., XYZ, XY, YZ, XZ, and the like). Similar logic can be applied for two or more items in any occurrence of "at least one . . . " and "one or more . . . " language.

The terms "about", "substantially", "essentially", "approximately", and the like, are defined as being "close to", for example as understood by persons of skill in the art. In some examples, the terms are understood to be "within 10%," in other examples, "within 5%", in yet further examples, "within 1%", and in yet further examples "within 0.5%".

Persons skilled in the art will appreciate that in some examples, the functionality of devices and/or methods and/or processes described herein can be implemented using pre-programmed hardware or firmware elements (e.g., application specific integrated circuits (ASICs), electrically erasable programmable read-only memories (EEPROMs), etc.), or other related components. In other examples, the functionality of the devices and/or methods and/or processes described herein can be achieved using a computing apparatus that has access to a code memory (not shown) which stores computer-readable program code for operation of the computing apparatus. The computer-readable program code could be stored on a computer readable storage medium which is fixed, tangible and readable directly by these components, (e.g., removable diskette, CD-ROM, ROM, fixed disk, USB drive). Furthermore, it is appreciated that the computer-readable program can be stored as a computer program product comprising a computer usable medium. Further, a persistent storage device can comprise the computer readable program code. It is yet further appreciated that the computer-readable program code and/or computer usable medium can comprise a non-transitory computer-readable program code and/or non-transitory computer usable medium. Alternatively, the computer-readable program code could be stored remotely but transmittable to these components via a modem or other interface device connected to a network (including, without limitation, the Internet) over a transmission medium. The transmission medium can be either a non-mobile medium (e.g., optical and/or digital and/or analog communications lines) or a mobile medium (e.g., microwave, infrared, free-space optical or other transmission schemes) or a combination thereof.

Persons skilled in the art will appreciate that there are yet more alternative examples and modifications possible, and that the above examples are only illustrations of one or more examples. The scope, therefore, is only to be limited by the claims appended hereto.

What is claimed is:

1. A mover device comprising:
a cold plate comprising: a movement axis; and slots therethrough arranged along the movement axis;
ferromagnetic cores extending through the slots;
first armature coils located around the ferromagnetic cores at a first side of the cold plate;
second armature coils located around the ferromagnetic cores at a second side of the cold plate opposite the first side of the cold plate; and
at least one field coil around one or more of the first armature coils and the second armature coils,
wherein the first armature coils and the second armature coils are arranged in groups respectively, the groups of first armature coils being operable at a relative phase with respect to the second armature coils.

2. The mover device of claim 1, wherein the first armature coils and the second armature coils are substantially symmetrical with each other, with respect to the cold plate therebetween.

3. The mover device of claim 1, wherein the first armature coils and the second armature coils are in communication with at least one armature controller configured to control the first armature coils and the second armature coils as a multi-phase electrical device such that the first armature coils, the second armature coils and the ferromagnetic cores are controlled to form at least one magnetic pole pair.

4. The mover device of claim 3, wherein the at least one armature controller is in communication with a position sensor configured to determine a position used to control a respective position of the at least one magnetic pole pair.

5. The mover device of claim 1, wherein the at least one field coil is in communication with at least one field coil controller configured to control the at least one field coil to form a loop of magnetic flux about perpendicular to the movement axis of the cold plate.

6. The mover device of claim 1, further comprising at least one retention device configured to retain the first armature coils and the second armature coils between the ferromagnetic cores.

7. The mover device of claim 6, wherein the at least one retention device includes one or more of a slot wedge and a ripple spring.

8. The mover device of claim 1, further comprising a plurality of cold plates, including the cold plate, and a plurality of armature coils, including the first armature coils and the second armature coils, the plurality of cold plates and the plurality of armature coils arranged such that a given cold plate is between a pair of armature coils.

9. The mover device of claim 1, further comprising one or more spacer blocks between the ferromagnetic cores and between respective armature coils located around the ferromagnetic cores, the one or more spacer blocks configured to conduct heat from one or more of the ferromagnetic cores and the respective armature coils to the cold plate.

10. The mover device of claim 1, wherein about equal portions of the ferromagnetic cores are located at each of the first side and the second side of the cold plate.

11. The mover device of claim 1, wherein the cold plate further comprises a non-ferromagnetic material.

12. The mover device of claim 1, wherein the cold plate further comprises slits configured to one or more of: interrupt conductive paths in the cold plate; and reduce eddy currents in the cold plate.

13. The mover device of claim 1, wherein the cold plate includes cooling channels.

14. The mover device of claim 1, further comprising an electrically insulating material encapsulating at least a portion of one or more of the cold plate, the ferromagnetic cores, the first armature coils, the second armature coils and the at least one field coil.

15. The mover device of claim 14, wherein at least a portion of the electrically insulating material is coated with one or more of a conductive material and a semi-conductive material.

16. The mover device of claim 1, further comprising a reinforcement member which runs along an edge of the cold plate.

17. The mover device of claim 16, wherein the edge of the cold plate, along which the reinforcement member runs, includes slits configured to reduce eddy currents.

18. The mover device of claim 1, further comprising one or more attachment units configured to attach the mover device to a payload.

* * * * *